United States Patent
Nagai et al.

(10) Patent No.: US 6,769,603 B2
(45) Date of Patent: Aug. 3, 2004

(54) DATA RECORDING AND REPRODUCING APPARATUS AND DATA REPRODUCING APPARATUS

(75) Inventors: Michio Nagai, Akiruno (JP); Hiroaki Miura, Hachioji (JP); Miyuki Shiojima, Hachioji (JP); Osamu Kowatari, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 10/095,724

(22) Filed: Mar. 14, 2002

(65) Prior Publication Data

US 2002/0159179 A1 Oct. 31, 2002

(30) Foreign Application Priority Data

| Mar. 15, 2001 | (JP) | 2001-074599 |
| Mar. 15, 2001 | (JP) | 2001-074600 |
| Mar. 15, 2001 | (JP) | 2001-074601 |
| Mar. 23, 2001 | (JP) | 2001-086160 |
| Apr. 10, 2001 | (JP) | 2001-111570 |
| Jan. 29, 2002 | (JP) | 2002-020399 |

(51) Int. Cl.$^7$ .................................................. G06F 17/00
(52) U.S. Cl. ............................ 235/375; 386/54; 386/96
(58) Field of Search .................. 235/375; 386/54, 386/96, 52; 360/13

(56) References Cited

U.S. PATENT DOCUMENTS 5,636,073 A * 6/1997 Yamamoto et al. ............ 360/13
5,991,496 A * 11/1999 Kojima .......................... 386/54
6,115,535 A * 9/2000 Iwamoto et al. ............... 386/96
6,339,668 B1 * 1/2002 Schmidt et al. ................ 386/52
6,377,519 B1 * 4/2002 Lee et al. .................. 369/30.04
6,453,113 B1 * 9/2002 Sakai et al. .................... 386/54

OTHER PUBLICATIONS

"Cool Edit 2000 1.1" audio recording and editing software, made available at http://www.download.com on Aug. 1, 2000.*

Syntrillium. Cool Edit Version 1.51 User's Manual.*

Comp630 Wav File Format Description.*

* cited by examiner

Primary Examiner—Daniel A. Hess
(74) Attorney, Agent, or Firm—Straub & Pokotylo; John C. Pokotylo

(57) ABSTRACT

A data recording and reproducing apparatus has a reproduction-only mode capable of reproducing a voice file and a recording and reproducing mode capable of recording and reproducing a voice file as an operating mode. An operating mode switching section automatically switches the operating mode to the recording and reproducing mode when an instruction to record a voice file is given in the reproduction-only mode. A recording section records the voice file after the operating mode is switched to the reproduction-only mode.

30 Claims, 22 Drawing Sheets

| Index value | Volume indication value | Set attenuation value | |
|---|---|---|---|
| | | Recorder mode | Player mode |
| 0 | 0 | -∞ | -∞ |
| | 1 | -36 | -36 |
| 1 | 2 | -34 | -34 |
| | 3 | -32 | -32 |
| | 4 | -30 | -30 |
| 2 | 5 | -28 | -28 |
| | 6 | -26 | -26 |
| | 7 | -24 | -24 |
| 3 | 8 | -22 | -22 |
| | 9 | -21 | -21 |
| | 10 | -20 | -20 |
| 4 | 11 | -19 | -19 |
| | 12 | -18 | -18 |
| | 13 | -17 | -17 |
| 5 | 14 | -16 | -16 |
| | 15 | -15 | -15 |
| | 16 | -14 | -14 |
| 6 | 17 | -13 | -13 |
| | 18 | -12 | -12 |
| | 19 | -11 | -12 |
| 7 | 20 | -10 | -12 |
| | 21 | -9 | -12 |
| | 22 | -8 | -12 |
| 8 | 23 | -7 | -12 |
| | 24 | -6 | -12 |
| | 25 | -5 | -12 |
| 9 | 26 | -4 | -12 |
| | 27 | -3 | -12 |
| | 28 | -2 | -12 |
| 10 | 29 | -1 | -12 |
| | 30 | 0 | -12 |

FIG. 21

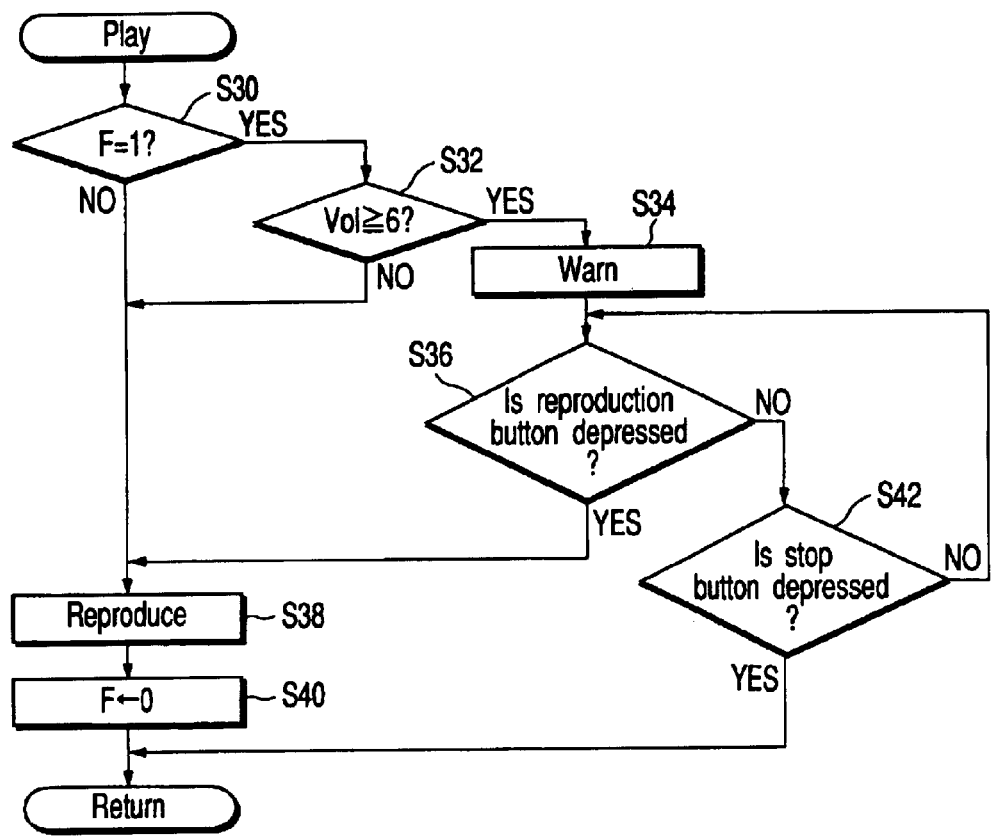
F I G. 28

DATA RECORDING AND REPRODUCING APPARATUS AND DATA REPRODUCING APPARATUS

CROSS-REFERENCE TO RELATED APPLICATIONS

This application is based upon and claims the benefit of priority from the prior Japanese Patent Applications No. 2001-74599 filed Mar. 15, 2001; No. 2001-74600 filed Mar. 15, 2001; No. 2001-74601 filed Mar. 15, 2001; No. 2001-86160 filed Mar. 23, 2001; No. 2001-111570 filed Apr. 10, 2001; and No. 2002-20399 filed Jan. 29, 2002, the entire contents of which are incorporated herein by reference.

BACKGROUND OF THE INVENTION

1. Field of the Invention

The present invention relates to a data recording and reproducing apparatus and a data reproducing apparatus.

2. Description of the Related Art

A voice recording and reproducing apparatus having a reproduction mode (player mode) capable of reproducing music data distributed by a pay database and the like and a recording and reproducing mode (voice memo mode or recorder mode) capable of recording voice data in an internal memory using a built-in microphone or reproducing it as operating modes, has recently been commercialized as one data recording and reproducing apparatus.

The above voice recording and reproducing apparatus has various problems as described above.

For example, when a user wishes to record voice data suddenly while he or she is listening to the voice data in a reproduction mode, the user usually stops a reproducing operation first, switches an operating mode from the reproduction mode to a recording and reproducing mode, and then pushing a recording button or the like to start recording.

The foregoing operations can smoothly be performed by persons who are used thereto. However, persons who are in a hurry or who are unaccustomed to the operations may require a lot of time or make a mistake, with the result that they will lose an opportunity to record a voice.

When a user wishes to reproduce a target reproduction position in the voice recording and reproducing apparatus, he or she has to repeat the following operation. Looking at a counter or the like, the user operates a fast-forward or fast-reverse switch to carry out a fast-forward or fast-reverse operation. Then, the user stops the operation if he or she reaches an approximate target position and reproduces a voice to confirm whether his or her desired voice is reproduced or not.

In order to resolve the above problem, a method of performing a fast-forward or fast-reverse operation while reproducing a voice can be considered. In this method, however, a target position is easy to find, but a fast-forward or fast-reverse operation has to be performed concurrently with reproduction. The speed of retrieval cannot be increased so greatly in terms of easiness to hear a reproduced voice, the load of a CPU, etc. and conversely the ability of retrieval becomes worse if a user can confirm an approximate position without reproducing any contents.

Some voice recording and reproducing apparatuses employ a plurality of coding schemes for coding voice data. In order to perform a fast-forward or fast-reverse operation while reproducing voice data, algorithm has to be prepared for each of the coding schemes, which causes a problem of increasing necessary internal memories.

For example, Jpn. Pat. Appln. KOKAI Publication No. 11-65600 discloses an apparatus for automatically making a beep at operator's preset time and then reproducing voice data designated in advance.

Assume that the foregoing automatic reproducing function is added to an apparatus with the above player mode and recorder mode. If an operating mode is set in the recorder mode at the preset time when music data of the player mode is designated as one to be reproduced automatically, the voice data to be reproduced automatically cannot be reproduced.

BRIEF SUMMARY OF THE INVENTION

Accordingly, a first object of the invention is to provide a data recording and reproducing apparatus capable of quickly performing a recording operation even in the reproduction mode as an operating mode.

A second object of the invention is to provide a data recording and reproducing apparatus that is excellent in retrieval ability of voice data.

A third object of the invention is to provide a data recording and reproducing apparatus that prevents audio data of different recording levels from being accidentally reproduced at high-volume levels when the audio data is reproduced.

A fourth object of the invention is to provide a data recording and reproducing apparatus capable of reliably reproducing voice data that is set as a target to be reproduced automatically.

In order to attain the above objects, a data recording and reproducing apparatus according to the present invention, which has a reproduction-only mode capable of reproducing a voice file and a recording and reproducing mode capable of recording and reproducing a voice file as an operating mode, comprises:

operating mode switching means for automatically switching the operating mode to the recording and reproducing mode when an instruction to record a voice file is given in the reproduction-only mode; and recording means for recording the voice file after the operating mode is switched to the reproduction-only mode.

A data recording and reproducing apparatus according to the present invention, which has a first operating mode capable of processing a voice file coded by a first coding scheme and a second operating mode capable of processing a voice file coded by a second coding scheme, comprises:

operating mode switching means for automatically switching an operating mode to the second operating mode when an instruction to record a voice file is given in the first operating mode; and recording means for recording the voice file by the second coding scheme after the operating mode is switched to the second operating mode.

A data recording and reproducing apparatus according to the present invention, comprises:

search means for fast-forwarding or fast-reversing voice data;

reproducing means for reproducing voice data; and control means for controlling reproduction of the fast-forwarded or fast-reversed voice data in accordance with a coding scheme of the voice data.

A data recording and reproducing apparatus according to the present invention, which has a player mode serving as an operating mode exclusively for reproduction of voice data and a recorder mode serving as an operating mode capable of recording and reproducing voice data, comprises:

search means for fast-forwarding or fast-reversing voice data;

reproducing means for reproducing voice data; and control means for controlling reproduction of the fast-forwarded or fast-reversed voice data in accordance with the operating modes.

A data recording and reproducing apparatus according to the present invention, which records and reproduces a plurality of types of audio data, comprises:

setting means for setting an upper limit of a reproduction level of at least one of the plurality of types of audio data;

reproduction level adjusting means for indicating a reproduction level of the audio data; and reproduction level control means for controlling a reproduction level indicated by the reproduction level adjusting means such that the reproduction level is the upper limit when the reproduction level exceeds the upper limit when the at least one of the plurality of types of audio data is reproduced.

A data recording and reproducing apparatus according to the present invention, which has a first operating mode capable of recording and reproducing an audio signal and a second operating mode exclusively for reproducing an audio signal, comprises setting means for setting an upper limit of a reproduction level when audio data is reproduced in the second operating mode.

A data recording and reproducing apparatus according to the present invention, which has a first operating mode capable of processing first coded data and a second operating mode capable of processing second data whose sound quality is higher than that of the first coded data, comprising:

warning means for giving a warning when a volume value is a given value or more when an operating mode is shifted to the above operating mode; and inhibiting means for inhibiting voice data from being reproduced until a given operation is performed when the volume value is the given value or more when the operating mode is shifted to the above operating mode.

A data recording and reproducing apparatus according to the present invention, which has a first operating mode capable of processing first coded data and a second operating mode capable of processing second data whose sound quality is higher than that of the first coded data, comprises:

warning means for giving a warning when a volume value is a given value or more when an operating mode is shifted to the above operating mode, wherein the warning means gives the warning and the inhibiting means inhibits the reproduction only when the first operating mode is shifted to the second operating mode.

A data recording and reproducing apparatus according to the present invention, which has a first operating mode capable of processing first coded data and a second operating mode capable of processing second data whose sound quality is higher than that of the first coded data, comprises:

warning means for giving a warning when a volume value is a given value or more when an operating mode is shifted to the above operating mode; and releasing means for releasing inhibition of reproduction of the voice data when the volume value is set to the given value or less while the reproduction of voice data is being inhibited.

A data reproducing apparatus according to the present invention, which has a first operating mode capable of reproducing a voice file coded by a first coding scheme and a second operating mode capable of reproducing a voice file coded by a second coding scheme, comprises:

time setting means for setting arbitrary set time;

selecting means for selecting an arbitrary voice file;

reproducing means for reproducing a voice file;

control means for performing control to reproduce the selected voice file when an operating mode in which the set time comes corresponds to an operating mode capable of reproducing the selected voice file; and warning means for giving a warning when the operating mode in which the set time comes differs from the operating mode capable of reproducing the selected voice file.

A data reproducing apparatus according to the present invention, which is capable of recording a first voice file processable only in a first operating mode and a second voice file processable only in a second operating mode, comprises:

time setting means for setting arbitrary set time;

selecting means for selecting an arbitrary voice file;

reproducing means for reproducing a voice file;

control means for performing control to reproduce the selected voice file when an operating mode in which the set time comes corresponds to an operating mode corresponding to the selected voice file; and warning means for giving a warning when the operating mode in which the set time comes differs from the operating mode capable of reproducing the selected voice file.

A data reproducing apparatus according to the present invention, which has a first operating mode capable of reproducing a voice file coded by a first coding scheme and a second operating mode capable of reproducing a voice file coded by a second coding scheme, comprises:

time setting means for setting arbitrary set time;

selecting means for selecting an arbitrary voice file;

reproducing means for reproducing a voice file; and control means for performing control to reproduce the selected voice file when an operating mode is an operating mode capable of reproducing the selected voice file when the set time comes, and change the operating mode to an operating mode corresponding to the selected voice file when the operating mode is not the an operating mode capable of reproducing the selected voice file and then reproduce the selected voice file.

A data reproducing apparatus according to the present invention, which is capable of recording a first voice file processable only in a first operating mode and a second voice file processable only in a second operating mode, comprises:

time setting means for setting arbitrary set time;

selecting means for selecting an arbitrary voice file;

reproducing means for reproducing a voice file; and control means for performing control to reproduce the selected voice file when an operating mode is an operating mode corresponds to the selected voice file when the set time comes, and changes the operating mode to the operating mode corresponding to the selected voice file when the operating mode is not the operating mode corresponding to the selected voice file and then reproducing the selected voice file.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 21 is a reproduction level adjustment table of the voice recording and reproducing apparatus.

FIG. 28 is a flowchart of a reproduction process executed when a reproduction button 55 is depressed in a P/S process.

DETAILED DESCRIPTION OF THE INVENTION (First Embodiment)

First, a configuration of a voice recording and reproducing apparatus according to a first embodiment of the present invention will be described in detail with reference to FIG. 1.

Figure 1:
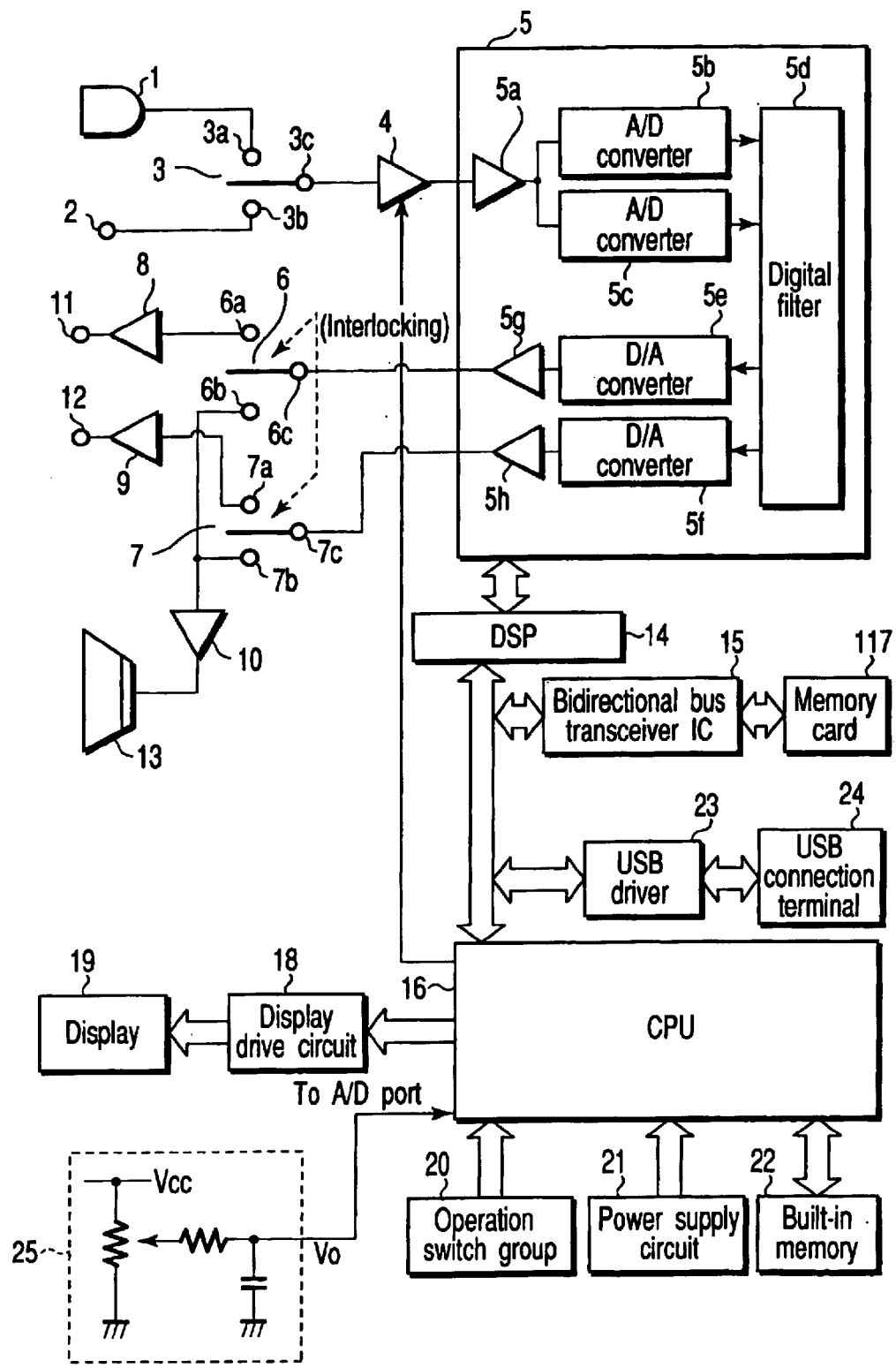
FIG. 1 is a block diagram for explaining a configuration of a voice recording and reproducing apparatus according to a first embodiment of the present invention.

In FIG. 1, the outputs of a microphone (referred to as a mike hereinafter) 1 and a mike jack 2 are selectively connected to the input of a preamplifier 4 via an input select switch 3. The output of the preamplifier 4 is connected to the input of an input amplifier 5a in a stereo codec 5, and the output of the input amplifier 5a is connected to the input of a digital filter 5d via A/D (Analog/Digital) converters 5b and 5c. The output of the digital filter 5d is connected to the inputs of output amplifiers 5g and 5h via D/A (Digital/Analog) converters 5e and 5f.

The outputs of the output amplifiers 5g and 5h are selectively connected to the inputs of headphone amplifiers 8 and 9 or the input of a speaker amplifier 10 by an output select switch 6. The output of the headphone amplifiers 8 and 9 are connected to headphone terminals 11 and 12. The output of the speaker amplifier 10 is connected to the input of a speaker 63.

The voice recording and reproducing apparatus includes a CPU 16 that controls the entire apparatus.

The CPU 16 is connected to a display 19 via a display drive circuit 18, a USB (Universal Serial Bus) connection terminal 24 via a driver 23, a memory card 117 via a bidirectional transceiver IC 15, and the stereo codec 5 via the DSP (Digital Signal Processor) 24. The CPU 16 is also connected to an operation switch group 20, a power supply circuit 21, a built-in memory 22, and a volume controller 25.

The stereo codec 5 converts a stereo signal from an analog signal to a digital signal and vice versa. In this embodiment, the codec 5 includes two A/D converters 5b and 5c for right and left channels; however, the mike 1 and mike jack 2 are monaural ones and thus a single input signal is supplied to both the A/D converters 5b and 5c.

The power supply circuit 21 supplies power for driving the voice recording and reproducing apparatus and includes a circuit (not shown) for power supply control, such as a battery, a battery check circuit, a power-on reset circuit, a step-up circuit, a step-down circuit, and an external power supply connection circuit. The built-in memory 22 contained in the main body is configured by an EEPROM that is a rewritable nonvolatile memory. It is however needless to say that the present invention is not limited to this configuration. The display 19 includes a two-color LED and a liquid crystal display having a backlight.

The memory card 117 is formed by a semiconductor memory such as a flash memory, which is shaped like a card that is detachable from the main body of the voice recording and reproducing apparatus. For example, Smart Media (trade name) can be adopted as the memory card 117.

The function of the voice recording and reproducing apparatus so configured will now be described.

First, the functions of respective components of the voice recording and reproducing apparatus according to the embodiment will be described in detail along the flow of a signal when voice is actually recorded.

The mike 1 converts voice into an electrical signal, while the mike jack 2 receives a voice signal from an external device such as an external mike. The input select switch 3 can freely switch between the mike and the mike jack.

In other words, the input select switch 3 selects the mike jack 2 when a terminal of the external device is connected to the mike jack 2 and selects the mike 1 in the other cases. In the voice recording and reproducing apparatus according to the embodiment of the invention, the mike 1 and mike jack 2 are designed for single-channel monaural input. It is however needless to say that the present invention is not limited to this operation.

A voice signal selected by the input select switch 3 is input to the preamplifier 4 and amplified.

The voice signal amplified by the preamplifier 4 is input to the input amplifier 5a of the stereo codec 5 that converts a signal from a voice signal to a digital signal and vice versa. The voice signal is amplified again by the input amplifier 5a and then converted into a digital signal by the A/D converters 5b and 5c. The digital signal is input to the digital filter 5d.

The digital filter 5d performs a process to eliminate unnecessary quantization noise called aliasing noise, which is generated when the above voice signal is converted into a digital voice signal, from the digital voice signal. The digital voice signal from which the quantization noise is eliminated is transferred to a DSP 14.

In the DSP 14, the input digital voice signal is coded (compressed and converted) in units of frame in accordance with a given format under the control of the CPU 16 to generate coded data. The voice recording and reproducing apparatus is designed to use a coding scheme called Digital Speech Standard (referred to as DSS hereinafter). It is however needless to say that the present invention is not limited to the coding scheme.

The coded data so generated is written in sequence to given addresses of the memory card 117 through a bidirectional bus transceiver IC 15 under the control of the CPU 16. The coded data written to the memory card 117 is processed in units of file (DSS file; data file coded by the DSS system). Since voice recording in the voice recording and reproducing apparatus is performed monaurally, only the coded data of the digital voice signal output from the A/D converter 5b is recorded in the memory card 117.

The functions of respective components will now be described in detail along the flow of a signal when the coded data is reproduced from the memory card 117.

First, the coded data is transferred in sequence from the memory card 117 to the DSP 14. The coded data transferred to the DSP 14 is decoded (expanded and converted) into digital data in units of given frame under the control of the CPU 16.

As will be described later, coded data other than the DSS file can be recorded in the memory card 117. Therefore, the DSP 14 determines what coding scheme is used for the coded data transmitted from the memory card 117 and decodes the coded data by the coding scheme.

The voice recording and reproducing apparatus can perform a decoding operation by at least the Windows Media (trade name) system (which is referred to as WMA system hereinafter and whose coded data file is referred to as WMA file, the Motion Picture Experts Group-I Audio Layer 3 system (which is referred to as MP3 format and whose coded data file is referred to as MP3 file), and the DSS system. The digital data decoded by the DSP 14 is transferred to the stereo codec 5. Unnecessary quantization noise is eliminated from the digital data so transferred by the digital filter in the stereo codec 5.

After that, the D/A converters 5e and 5f convert digital data into analog audio signal in each of the right and left channels, and the analog signal is amplified by output amplifiers 5g, 5h and output from the stereo codec.

If the original coded data is monaural data, it is processed and output after the same signal is input to the right and left channels. The destinations of the audio signals of the right and left channels, which are output from the stereo codec 5, are switched by the output select switches 6 and 7 that are associated with each other.

In other words, the audio signals of the right and left channels are selectively supplied to one of headphone terminals 11 and 12, which reproduce an audio signal using external reproduction equipment to which an external headphone or the like is connected, and the speaker 63 included in the main body of the voice recording and reproducing apparatus by the output select switches 6 and 7.

The display 19 displays an operating state of the voice recording and reproducing apparatus under the control of the display drive circuit 18. As will be described in detail later, the operation switch group 20 is provided outside the voice recording/reproducing apparatus in order to control various functions. The built-in memory 22 stores various types of setting and parameters, such as user ID, selective setting of recording mode (standard mode/long-playing mode), selective setting of BEEP sound (ON/OFF), and reproduction position of data, which are to be recorded even though no power supply voltage is supplied to the CPU 16. The built-in memory 22 stores set time of alarm reproduction, information for specifying a file to be reproduced, and the like.

The voice recording and reproducing apparatus can be connected to an external device such as a personal computer and perform the following process by bidirectional communication with the external device.

More specifically, for example, a coded data file recorded on a hard disk of a personal computer or the like can be transferred to the memory card 117. A coded data file recorded on the memory card 117 can also be transferred to a recording medium of a personal computer. Moreover, a voice signal supplied from the mike 1 can be converted into digital data by the stereo codec 5, the digital data can be coded by the DSP 14, and the coded data can directly be recorded on a recording medium of a personal computer.

In order to communicate with the above external device such as a personal computer, the voice recording and reproducing apparatus according to the first embodiment can be connected with the device via a USB cable. The external connection terminal 24 is a connection terminal to be connected with the USB cable and. The terminal 24 is controlled by the communication driver 23 and connected to the CPU 16 through an internal bus.

The volume controller 25 applies a voltage of 0 to Vcc to an A/D port of the CPU 16 as an output voltage Vo in association with the turn of the volume control 67 described later. The CPU 16 receives the output voltage Vo and converts it into digital data. Then, the CPU 16 divides the data into 31 volume set values of 0 to 30.

An operating mode of the voice recording and reproducing apparatus will now be described.

The voice recording and reproducing apparatus has two operating modes. One of them is a first operating mode in which a voice supplied from the mike or mike jack can be recorded and reproduced (hereinafter referred to as "recorder mode"). The other is a second operating mode in which no recording operation can be performed but a coded data file recorded on a recording medium can be reproduced (hereinafter referred to as "player mode").

In the "recorder mode," it is assumed that the voice recording and reproducing apparatus according to the first embodiment is used chiefly for recording a message memo, a dictation, a meeting, etc. A DSS system that is suitable for high-compression, long-playing recording is used as a coding scheme.

On the other hand, in the "player mode," it is assumed that the apparatus is used chiefly for listening to music. A WMA format and an MP3 format capable of high-audio-quality reproduction are each used as a coding scheme.

Figure 2A:
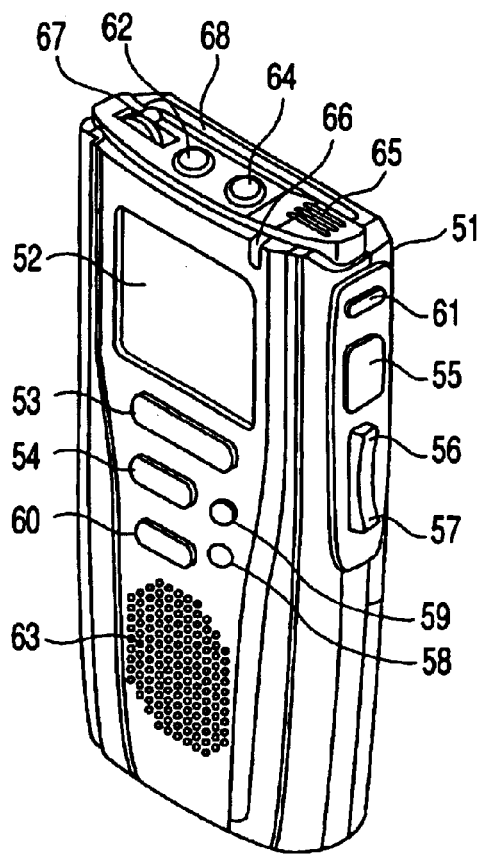
FIGS. 2A and 2B are illustrations for explaining in detail an outward appearance of the voice recording and reproducing apparatus according to the embodiment of the present invention.

An outward appearance of the voice recording and reproducing apparatus according to the first embodiment will now be described in detail with reference to FIGS. 2A, 2B and 3. In FIG. 2A, a main display 52 is disposed in front of a main body 51 of the voice recording and reproducing apparatus.

The main display 52 includes a liquid crystal display (LCD) to display the remaining amount of battery, recording modes, file numbers, user ID, various times, operating states, etc.

The recording button 53 is a button to given an instruction to start recording a voice signal. A stop button 54 is a button to give an instruction to stop the apparatus from performing a recording operation, a reproducing operation, or the like. An index button 59 is a button whose functions vary between the recorder and player modes described above. In the recorder mode, an index mark is added to a coded data file under recording. In the player mode, several frequency characteristics that are suitable for music to be reproduced are prepared (five types of normal, pops, jazz, classic, and user definition), and a desired frequency characteristic is selected and serves as a button for changing a reproduced sound.

A menu button 60 is a button for making various settings related to the voice recording and reproducing apparatus, such as settings of recording modes, times, alarm reproduction, and user ID. In the player mode, it is possible to make a setting of the maximum volume (described later) as well as a setting of alarm reproduction, a selection between a surround-sound effect and a special effect such as bass amplification.

An erase button 58 is a button to erase a coded data file, which is selected using a fast-reverse button 56, a fast-forward button 57 or the like, from the memory card 117. A speaker 63 is disposed under the menu button 60.

In FIG. 2A, a folder button 61, a reproduction button 55, a fast-reverse button 56, and a fast-forward button 57 are arranged on one side of the voice recording and reproducing apparatus. The functions of the folder button 61 vary between the recorder and player modes. In the recorder mode, the memory card 117 includes a plurality of folders for storing coded data files. The button 61 serves to select one from among the folders. In the player mode, the button 61 serves to set a repeat reproduction mode.

The reproduction button 55 is a button to give an instruction to start reproducing a coded data file recorded on the memory card 117. The fast-reverse button 56 is a button to fast-reverse a coded data file under reproduction, decrement file numbers when a coded data file for reproduction is selected, and decrement parameters when a menu is set. The fast-forward button 57 is a button to fast-forward or fast-reproduce a coded data file under reproduction, increment file numbers when a coded data file for reproduction is selected, and increment parameters when a menu is set. These fast-reverse and fast-forward buttons 56 and 57 are formed integrally as a so-called "seesaw switch."

As shown, a headphone jack 62, a mike jack 64, a mike 65, an indicator 66, a volume control 67, and a recording medium insertion slot 68 are arranged on the top surface of the voice recording and reproducing apparatus.

The indicator 66 chiefly displays a reproducing or recording operation state and employs a two-color LED. The indicator lights up green during reproduction and lights up red during recording. The indicator 66 is also used to display an alarm and blinks red when it gives the alarm to a user for some reason.

The recording medium insertion slot 68 is an opening into which the memory card 117 is inserted. The volume control 67 is an analog reproduction level adjustment member that can be turned to adjust a level of reproduction from the headphone jack 62 and the speaker 63. The structure of the volume control 67 is shown in detail in FIG. 3.

Figure 3:
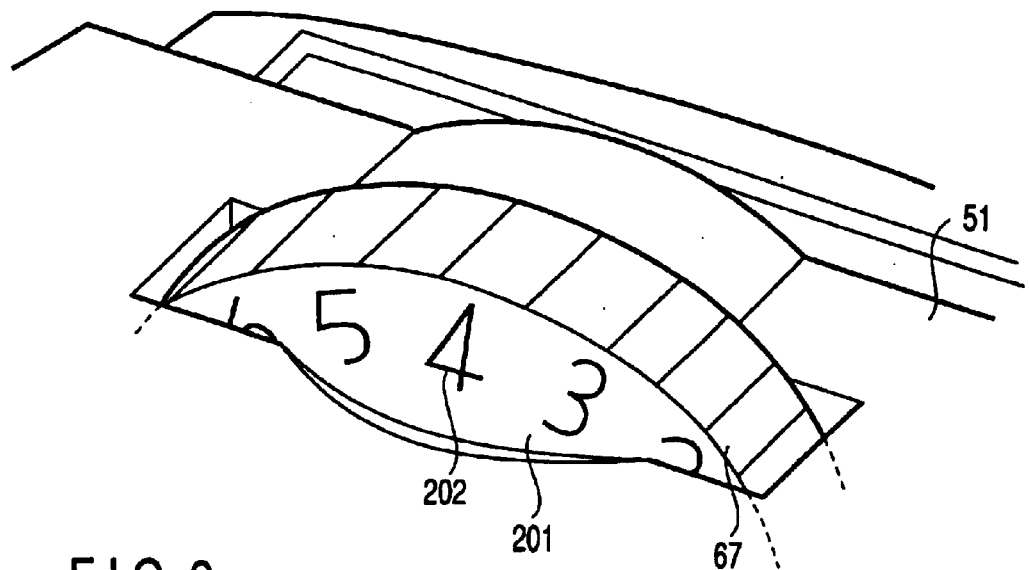
FIG. 3 is an illustration showing a volume control 67 in detail.

As shown in FIG. 3, the volume control is formed of a disk-shaped member and has indices 202 of 1 to 10. Since part of the volume control protrudes from the main body, an operator can read an index of the peak of the protruded part to confirm a set value of the reproduction level.

FIG. 3 shows an index of "4" set as a reproduction level. The volume control 67 is connected to a variable resistor. When the volume control 67 is turned, the resistance of the variable resistor varies, as does the output voltage Vo of the volume controller 25. Since the CPU 16 recognizes volume set values of the volume control 67 on a scale of 31 stages, the reproduction level can be adjusted in steps the number of which is larger than that of the actually-displayed indices.

Figure 2B:
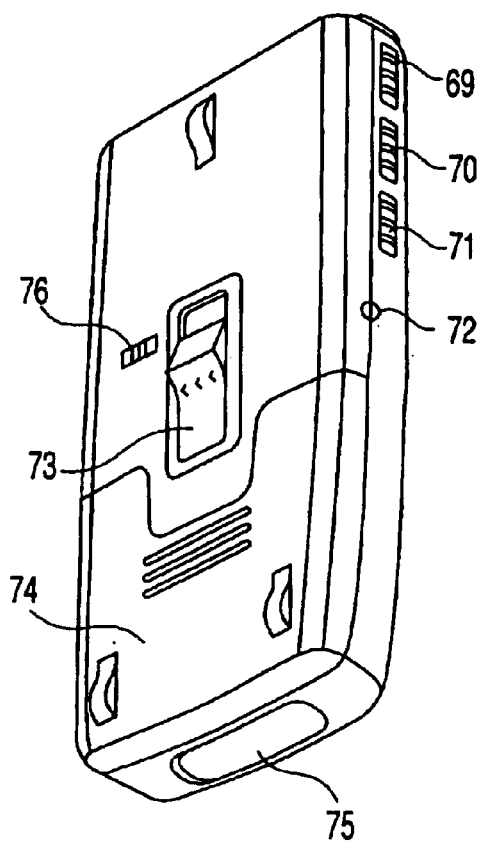

In FIG. 2B, an operating mode switch 69, a mike sensitivity switch 70, a hold switch 71, and a power supply jack 72 are arranged on the other side of the voice recording and reproducing apparatus. The operating mode switch 69 is a switch to switch the operating mode of the voice recording and reproducing apparatus between the foregoing recorder mode and player mode. The mike sensitivity switch 70 is a switch to set an input level of the mike 65 and switch the input level between high sensitivity (conference mode) and low sensitivity (dictation mode). Furthermore, the hold switch 71 is a switch to reject the input operation of the switches and set and release a so-called "hold function" of shifting an operating mode of the voice recording and reproducing apparatus to a power saving mode when the apparatus is stopped.

Moreover, an eject button 73, a main switch 76, and a battery cover 74 are arranged on the back surface of the voice recording and reproducing apparatus, and an external connection terminal 75 is connected to the bottom surface thereof. The eject button 73 is used to remove the memory card 117 from the recording medium insertion slot 68. The external connection terminal 75 is connected to an external device such as a personal computer to communicate therewith. In the voice recording and reproducing apparatus, a USB terminal is used to connect the apparatus with an external device. It is however needless to say that the present invention is not limited to the USB terminal.

The main switch 76 is a switch for turning on/off the operation of the present voice recording and reproducing apparatus. When the main switch 76 turns on, it is mechanically associated with the eject button 73 to prevent the memory card 117 from being removed. The foregoing operation buttons are push-button switches that are turned on by depression.

Figure 4:
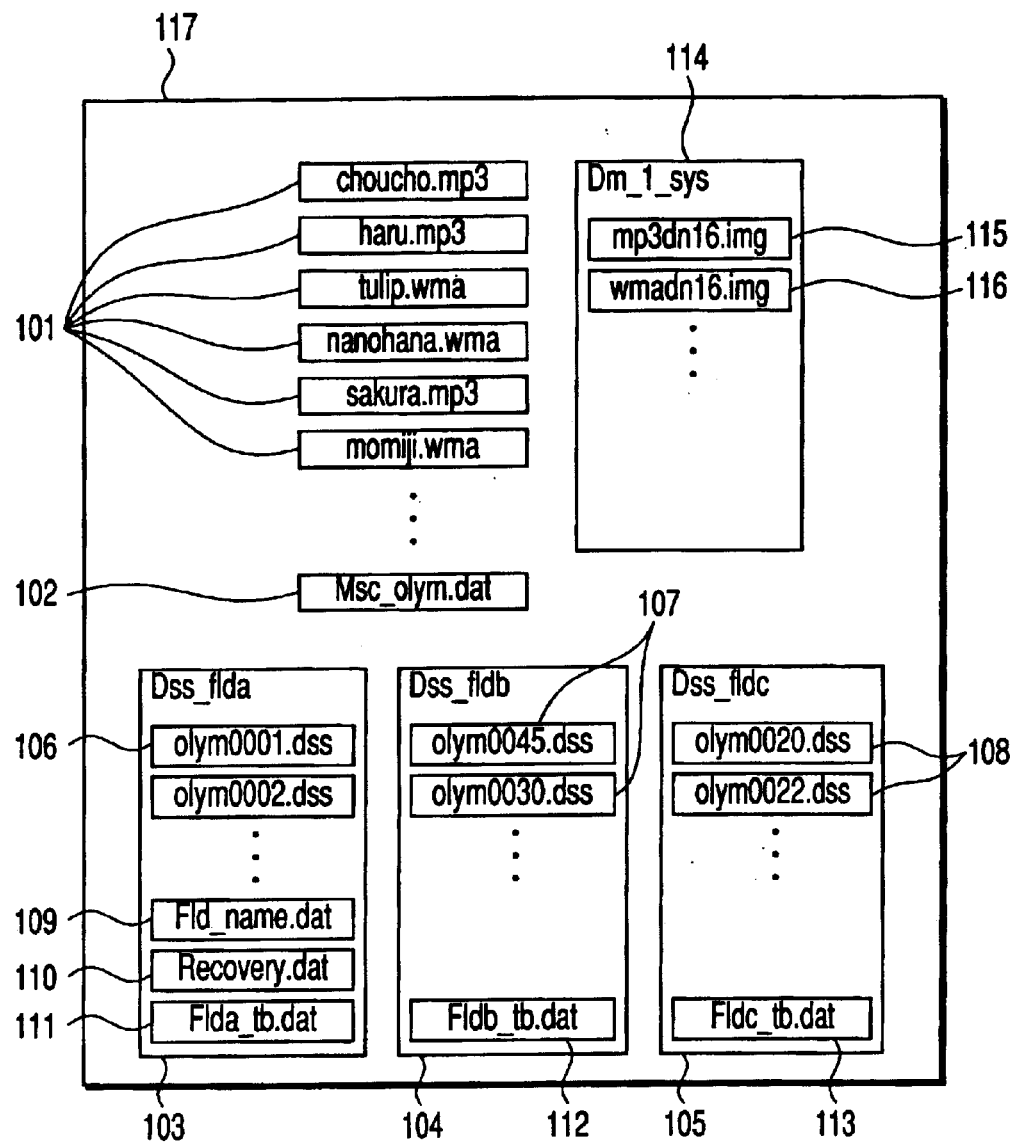
FIG. 4 is a diagram for explaining how data is recorded in a memory card 117 used in the voice recording and reproducing apparatus according to the embodiment of the present invention.

An explanation as to how data is recorded on the memory card 117 used in the present voice recording and reproducing apparatus according to the first embodiment will now be given with reference to FIG. 4.

A coded data file 101, a music order data file 102, DSS file folders 103, 104 and 105, and a codec data file 114 are recorded in the root of the memory card 117. The coded data file 101 has an extension "mp3" or "wma", which shows music data coded by the MP3 or WMA format. The coded data file can be reproduced in the player mode described above.

The music order data file 102 is a file that has the order of reproduction of coded data files in the player mode as table data. To change the order of reproduction, the music order file 102 is rewritten under the control of the CPU 16.

The DSS file folders 103, 104 and 105 are folders for storing DSS files. In the recorder mode, three folders A, B and C are provided to arrange the DSS files, and the DSS file folders 103, 104 and 105 correspond to the folders A, B and C.

DSS files 106, 107 and 108 are stored in the DSS file folders 103, 104 and 105, respectively and can be reproduced in the recorder mode. During the recording, a DSS file is created in any one of the DSS file folders 103, 104 and 105.

The orders of reproduction of the DSS files 106, 107 and 108 are recorded as table data in reproduction order data files 111, 112 and 113 of the respective folders. In the voice recording and reproducing apparatus according to the first embodiment, the number of recordable files per folder is 199 and the total number is 597 in consideration of the ability of the main display 52 to display, the operator's usability, or the like.

A folder name data file 109 and a recovery data file 110 as well as the above-described files are recorded in the DSS file folder 103.

In the present voice recording and reproducing apparatus, the names of the above folders A, B and C can be changed to arbitrary display names on the main display 52.

Data for making the display names correspond to the DSS folder files 103, 104 and 105 is recorded in the folder name data file 109.

The recovery data file 110 is a file in which data for recovering data in the DSS file folders 103, 104 and 105 when the data is destroyed for some reason is recorded.

The codec folder 114 is a folder for storing codec files 115 and 116 of coded data files reproduced in the player mode.

The extensions of corresponding coded data files are used for the first three letters of the file names of the codec files 115 and 116. These codec files have an extension "img". The codec files of the DSS files are stored in a ROM of the CPU 16. During the reproduction, the DSP 14 reads and decodes the codec files.

Figure 5:
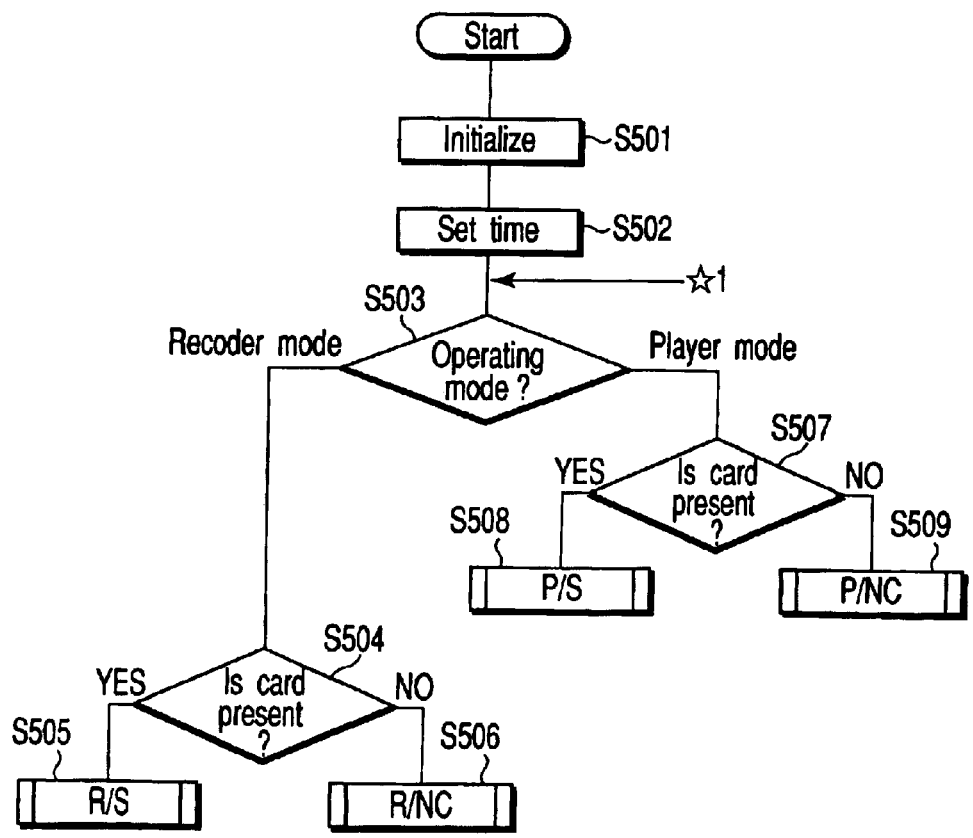
FIG. 5 is a main flowchart of the voice recording and reproducing apparatus.

FIG. 5 is a main flowchart of the present voice recording and reproducing apparatus.

The apparatus starts to operate when power is supplied to the circuits by loading a battery. First, initialization such as clearance of memories, setting of various parameters, and resetting of hardware is performed (step S501). Then, the present time is set (step S502).

The flow advances to step S503 to detect whether an operating mode is set in the recorder mode or the player mode. Specifically, the CPU 16 detects in which of the modes the operating mode switch 69 is set. After that, it is determined whether the memory card 117 is inserted into the main body (steps S504 and S507). When the switch is set in the recorder mode and the memory card 117 is inserted into the main body, the flow advances to step S505 (R/S process). If the memory card 117 is not inserted into the main body, the flow moves to step S506 (R/NC process). If the switch is set in the player mode and the memory card 117 is inserted, the flow advances to step S508 (P/S process). If the memory card 117 is not inserted, the flow advances to step S509 (P/NC process). Thus, a process is performed in accordance with the operating mode and the presence or absence of the memory card 117.

Figure 6:
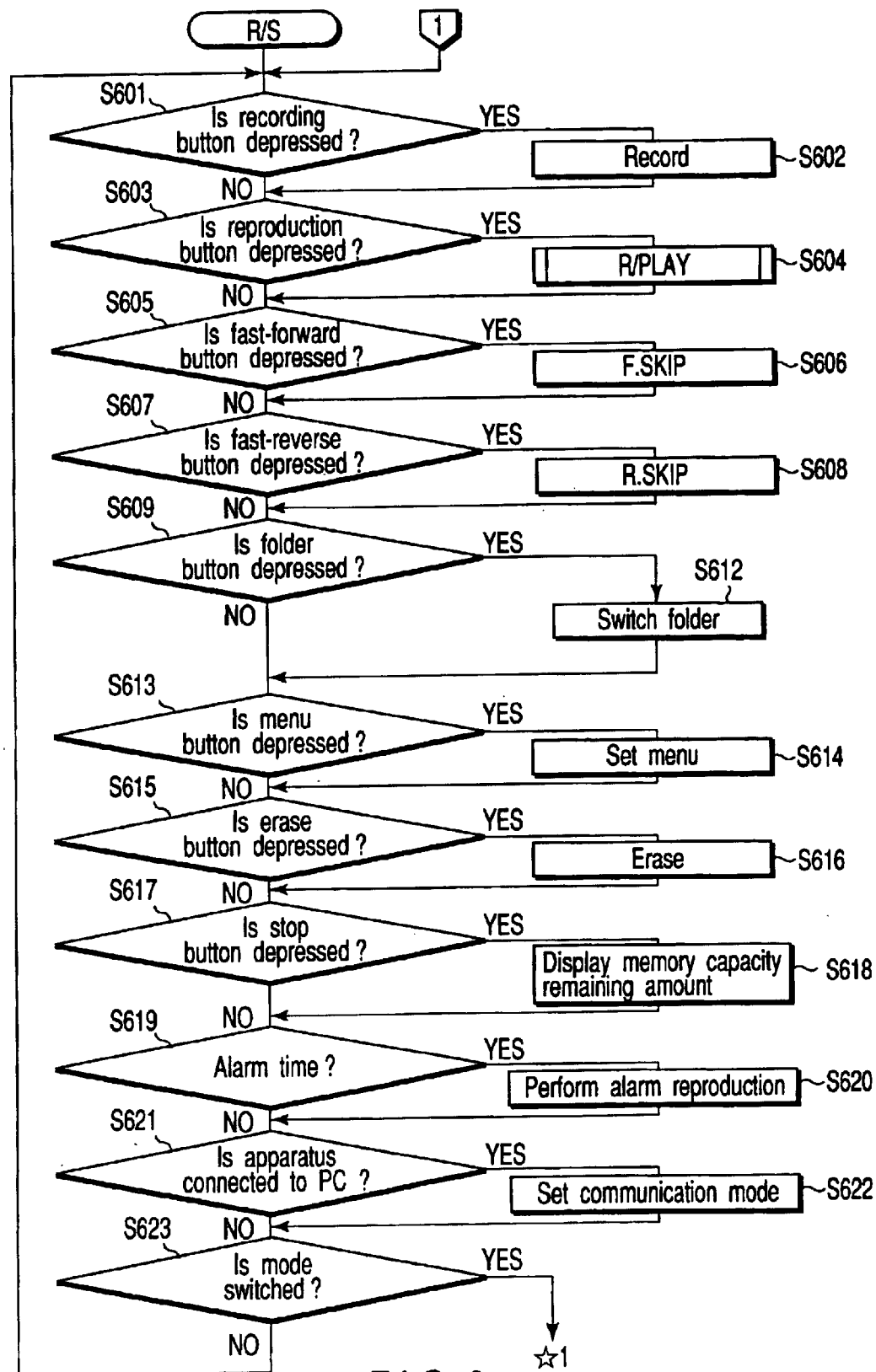
FIG. 6 is a flowchart showing a process executed when an operating mode is set in a recorder mode and the memory card 117 is inserted.

FIG. 6 is a flowchart showing a process to be executed when the operating mode is set in the recorder mode and the memory card 117 is inserted.

First, it is determined whether the recording button 53 is depressed or not (step S601). When the recording button 53 is depressed, a recording process is performed (step S602).

If the recording button 53 is not depressed, the flow advances to step S603 to determine whether the reproduction button 55 is depressed or not. When the reproduction button 55 is depressed, an R/PLAY process, which will be described in detail later, is performed (step S604).

If the reproduction button 55 is not depressed, the flow advances to step S605 to determine whether the fast-forward button 57 is depressed or not. When the fast-forward button 57 is depressed, a forward skip operation (F. SKIP) is performed or data file numbers are incremented one by one to move a file to be reproduced or edited (step S606).

If the fast-forward button 57 is not depressed, the flow advances to step S607 to determine whether the fast-reverse button 56 is depressed or not. When the fast-reverse button 56 is depressed, a reverse skip operation (R. SKIP) is performed or data file numbers are decremented one by one to move a file to be reproduced or edited (step S608).

If the fast-reverse button 56 is not depressed, the flow advances to step S609 to determine whether the folder button 61 is depressed or not. When the folder button 61 is depressed, three folders for storing the DSS files provided in the memory card 117 are switched (step S612). The folders are cyclically switched for each operation as follows: folder A→folder B→folder C→folder A→ . . . . After that, the flow advances to step S613.

If the folder button 61 is not depressed, the flow advances to step S613.

In step S613, it is determined whether the menu button 60 is depressed or not. When the menu button 60 is depressed, a menu setting process for making various settings regarding the recorder mode is performed (step S614), and the flow advances to step S615. If the menu button 60 is not depressed, the flow advances to step S615 to determine whether the erase button 58 is depressed or not. When the erase button 58 is depressed, an erase process is executed (step S616) to erase a desired DSS file. After that, the flow advances to step S617.

If the erase button 58 is not depressed, the flow advances to step S617 to determine whether the stop button 54 is depressed or not. When the stop button 54 is depressed, the remaining capacity of the memory is displayed (step S618). Specifically, the CPU 16 detects a free space of the memory card 117 and calculates a recordable time representing how long data can be recorded on the card in the currently-set recording mode. The recordable time is displayed on the main display 52 only while the stop button 54 is being depressed.

When the stop button 54 is not depressed, the flow advances to step S619 to determine whether alarm reproduction time comes or not. When it is determined that the alarm reproduction time comes, alarm reproduction, which will be described in detail later, is performed (step S620).

If it is determined that the alarm reproduction time does not come, the flow advances to step S621 to determine whether or not the apparatus is connected to a personal computer as an external device via a USB cable. When it is determined that the apparatus is connected to the personal computer, a communication mode is set to communicate with the personal computer (step S622).

If it is determined that the apparatus is not connected to the personal computer, the flow advances to step S623 to determine whether the operating mode switch 69 switches the operating mode. If it is determined that the operating mode switch 69 switches the mode, the flow returns to step S503 shown in FIG. 5. If not, the flow returns to step S601.

Figure 7:
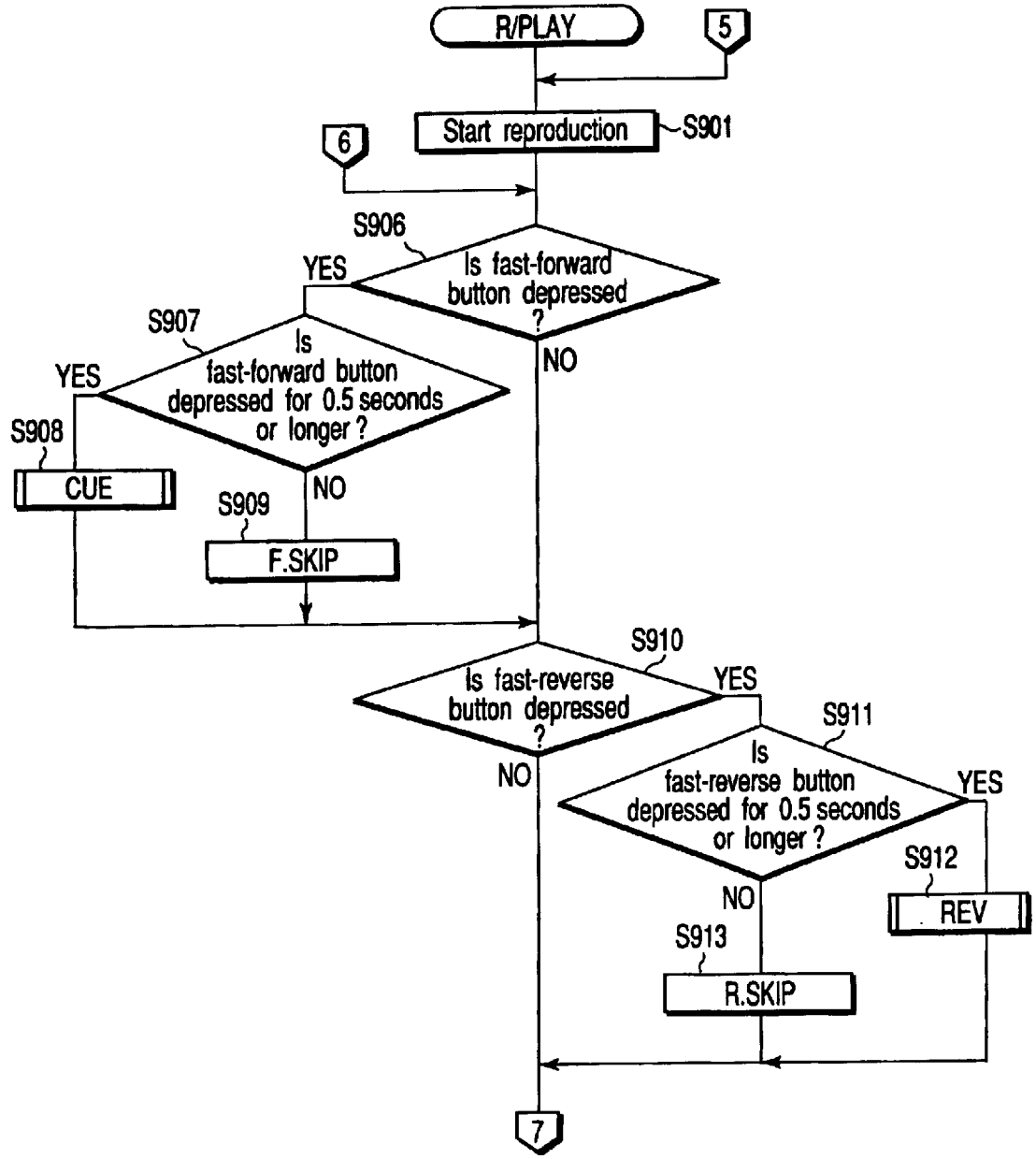
FIG. 7 is a flowchart (part 1) of an R/PLAY process that is a reproduction process in the recorder mode.
Figure 8:
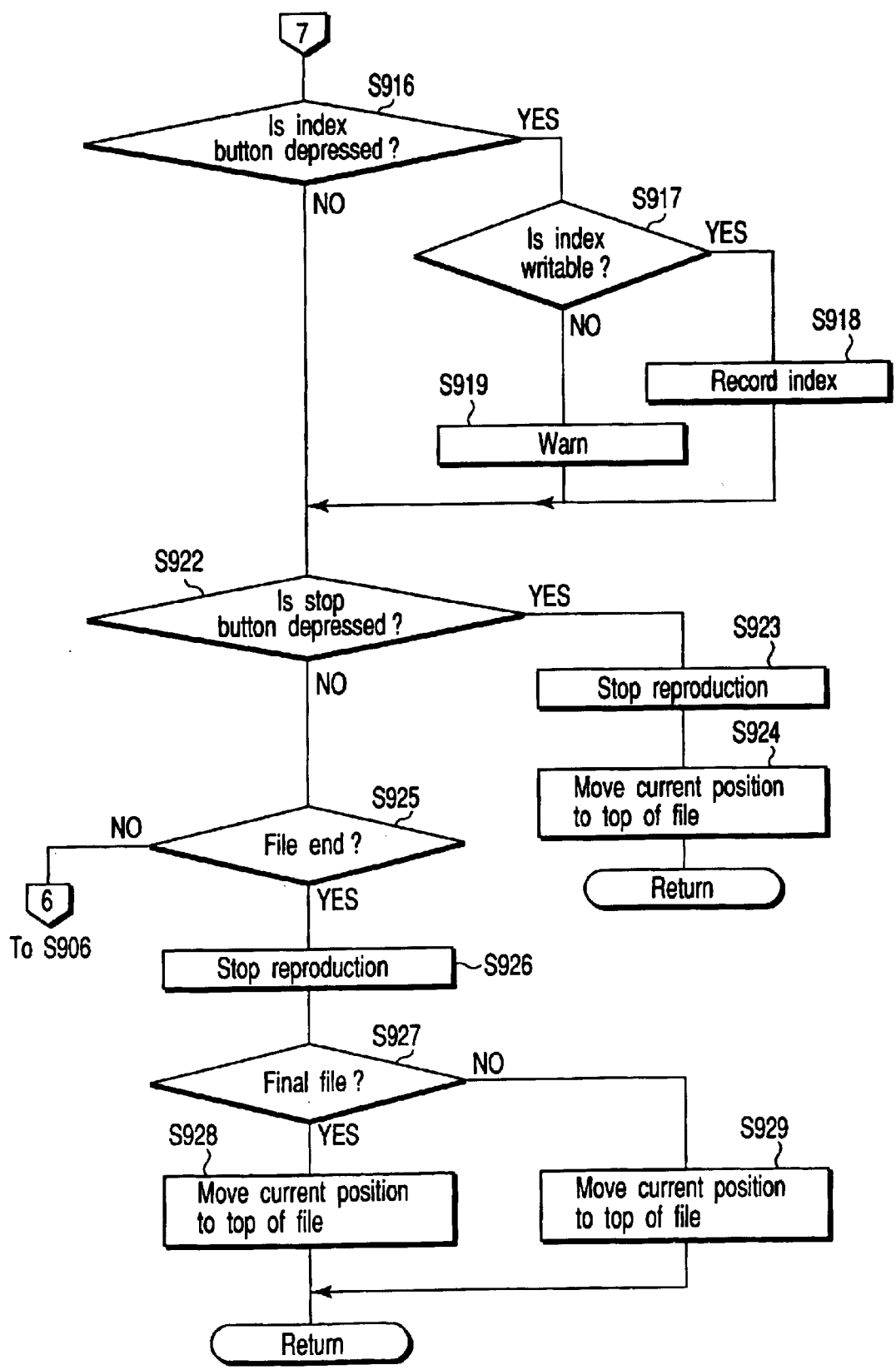
FIG. 8 is a flowchart (part 2) of the R/PLAY process that is a reproduction process in the recorder mode.

FIGS. 7 and 8 are flowcharts showing the R/PLAY process as a reproduction process in the recorder mode.

First, information of the current position of a file is read out and reproduction is started from the position (step S901). Then, it is determined whether the fast-forward button 57 is depressed or not (step (S906). When the fast-forward button 57 is depressed, it is also determined whether its duration is 0.5 seconds or longer or not (step S907). If the duration is 0.5 seconds or longer, a CUE process is performed as a fast-forward reproduction process (step S908), which will be described later. If the depression time of the fast-forward button 57 is shorter than 0.5 seconds, a forward skip operation (F. SKIP) is carried out (step S909).

If the fast-forward button 57 is not depressed, it is determined whether the fast-reverse button 56 is depressed or not (step S910). When the fast-reverse button 56 is depressed, it is also determined whether its duration is 0.5 seconds or longer or not (step S911). If the duration is 0.5 seconds or longer, an REV process is performed as a fast-reverse reproduction process (step S912), which will be described later. If the depression time of the fast-reverse button 56 is shorter than 0.5 seconds, a reverse skip operation (R. SKIP) is performed (step S913).

If the fast-reverse button 56 is not depressed, it is determined whether the index button 59 is depressed or not (step S916). When it is determined that the index button 59 is depressed, it is determined whether an index mark can be recorded or nor (step S917). If a file under reproduction is not in a write-protect state or the number of index marks in a file under reproduction is 15 or smaller, or if the index marks can be recorded, the index marks are recorded in positions when the index button 59 is depressed (step S918). If not, a key mark showing a write-protect file or an alarm "INDEX FULL" showing that the index mark is not recorded any more blinks on the main display 52 for two seconds (step S919).

If the index button 59 is not depressed, it is determined whether the stop button 54 is depressed or not (step S922). When the stop button 54 is depressed, a reproduction operation is stopped (step S923) and the current position information of the file is updated to the top of the file whose reproduction is stopped (step S924). The R/PLAY process ends.

If the stop button 54 is not depressed, it is determined whether the reproduction position reaches the end of the file under reproduction (step S925). When the reproduction position reaches the end of the file under reproduction, the reproduction operation is stopped (step S926) to determine whether it is the final file in the current folder (step S927). If the file is the final one, the current position information of the file is updated to the top of the final file (step S928). If the file is not the final one, the current position information of the file is updated to the top of a file next to the file whose reproduction is completed (step S929).

If the reproduction position does not reach the end of the file in step S925, the flow returns to step S902 and the above process is repeated.

Figure 9:
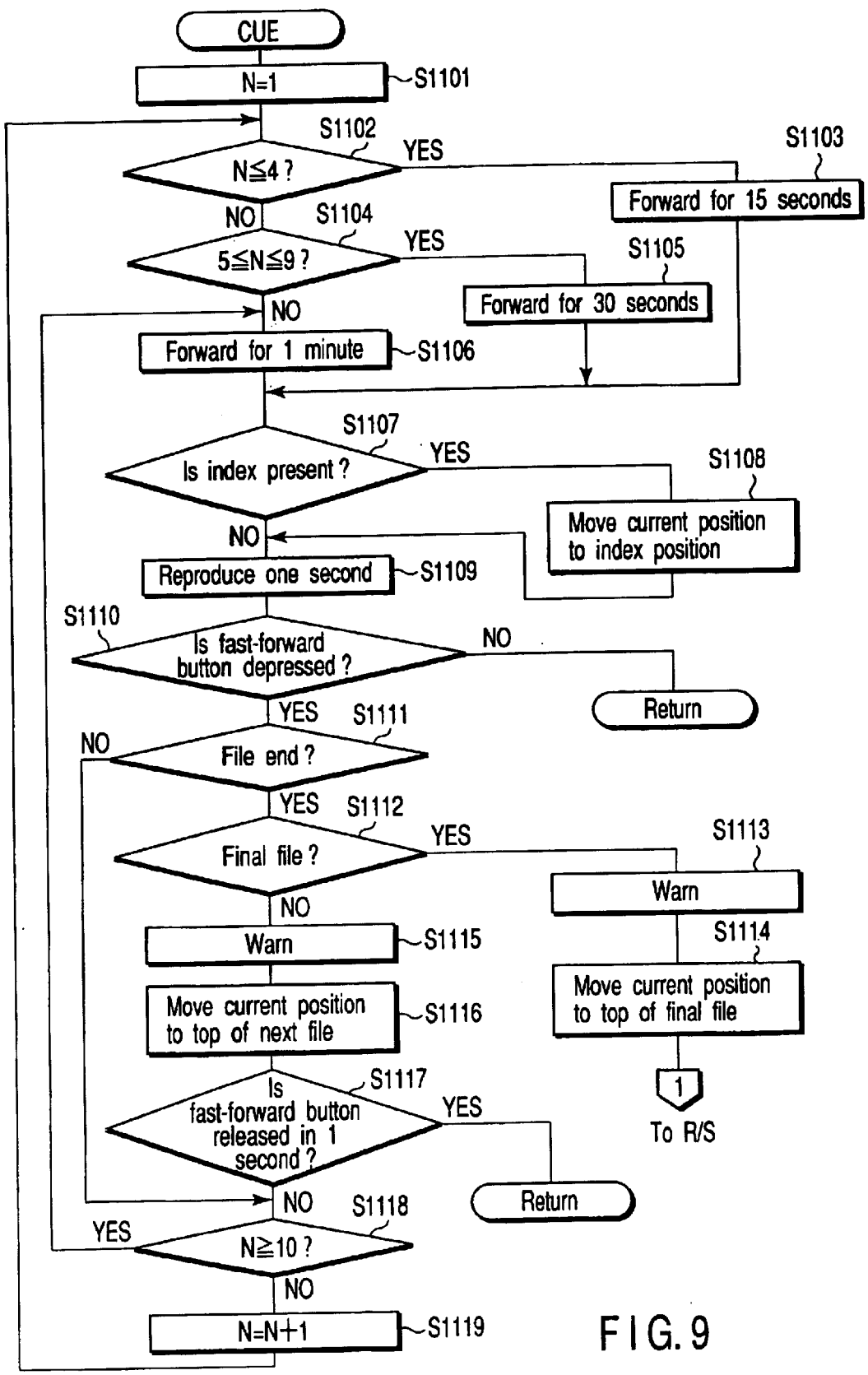
FIG. 9 is a flowchart of a CUE process that is a fast-forward reproduction process.

FIG. 9 is a flowchart showing a CUE process as a fast-forward reproduction process. First, 1 is set to a counter N (step S1101). Then, it is determined whether or not the value of counter N is 4 or less (step S1102). When it is determined that the value of counter N is 4 or less, the current position information of a file is forwarded 15 seconds (step S1103), and the flow advances to step S1107.

If it is determined that the value is not 4 or less in step S1102, the flow advances to step S1104 to determine whether the value of counter N is 5 or more and 9 or less. When the value is 5 or more and 9 or less, the current position information of the file is advanced 30 seconds (step S1105), and the flow advances to step S1107.

If it is determined that the value is not 5 or more and 9 or less in step S1104, the current position information of the file is forwarded one minute (step S1106), and the flow advances to step S1107.

In step S1107, it is determined whether an index mark is added to a fast-forwarded portion in step S1103, S1105 or S1106. If the index mark is added to the fast-forwarded portion, the current position information of the file is moved to the portion to which the index mark is added (step S1108).

Thereafter, a one-second file is reproduced from a portion corresponding to the current position information of the file (step S1109). If a given mute time is set in accordance with the amount of fast-forward prior to the reproduction of the file, the operability is more improved. In this time, a 1.5×-speed reproduction can be performed. It is then determined whether the fast-forward button 57 continues to be depressed or not (step S1110). If the fast-forward button 57 is not depressed, the CUE process ends.

If the fast-forward button 57 continues to be depressed, it is determined whether the reproduction position reaches the end of the file under the CUE process (step S1111). If the reproduction position reaches the end of the file, it is determined whether the file is the final one in the current folder (step S1112). When the file is the final one, an alarm indicative of the final file is issued from the speaker 63 (step S1113) and the current position information of the file is moved to the top of the final file (step S1114). The CUE process ends and the flow advances to the P/S process.

If it is determined that the file is not the final one in step S1112, an alarm indicating that the reproduction position reaches the end of the file under the CUE process is issued from the speaker 63 (step S1115), and the current position information of the file is moved to the top of the next file (step S1116). Then, it is determined whether the depression of the fast-forward button 57 is released or not within one second after the alarm is issued (step S1117). When the depression of the fast-forward button 57 is released within one second, the CUE process ends and the flow returns.

If the depression of the fast-forward button 57 is not released within one second in step S1117 and if it is determined whether the reproduction position does not reach the end of the file in step S111, it is determined whether the value of counter N is 10 or more (step S1118). If the value of counter N is less than 10, the value is incremented (step S1119). The flow returns to step S1102 and the above process is repeated. If the value of counter N is 10 or more, the flow returns to step S1106 and the above process is repeated.

Figure 10:
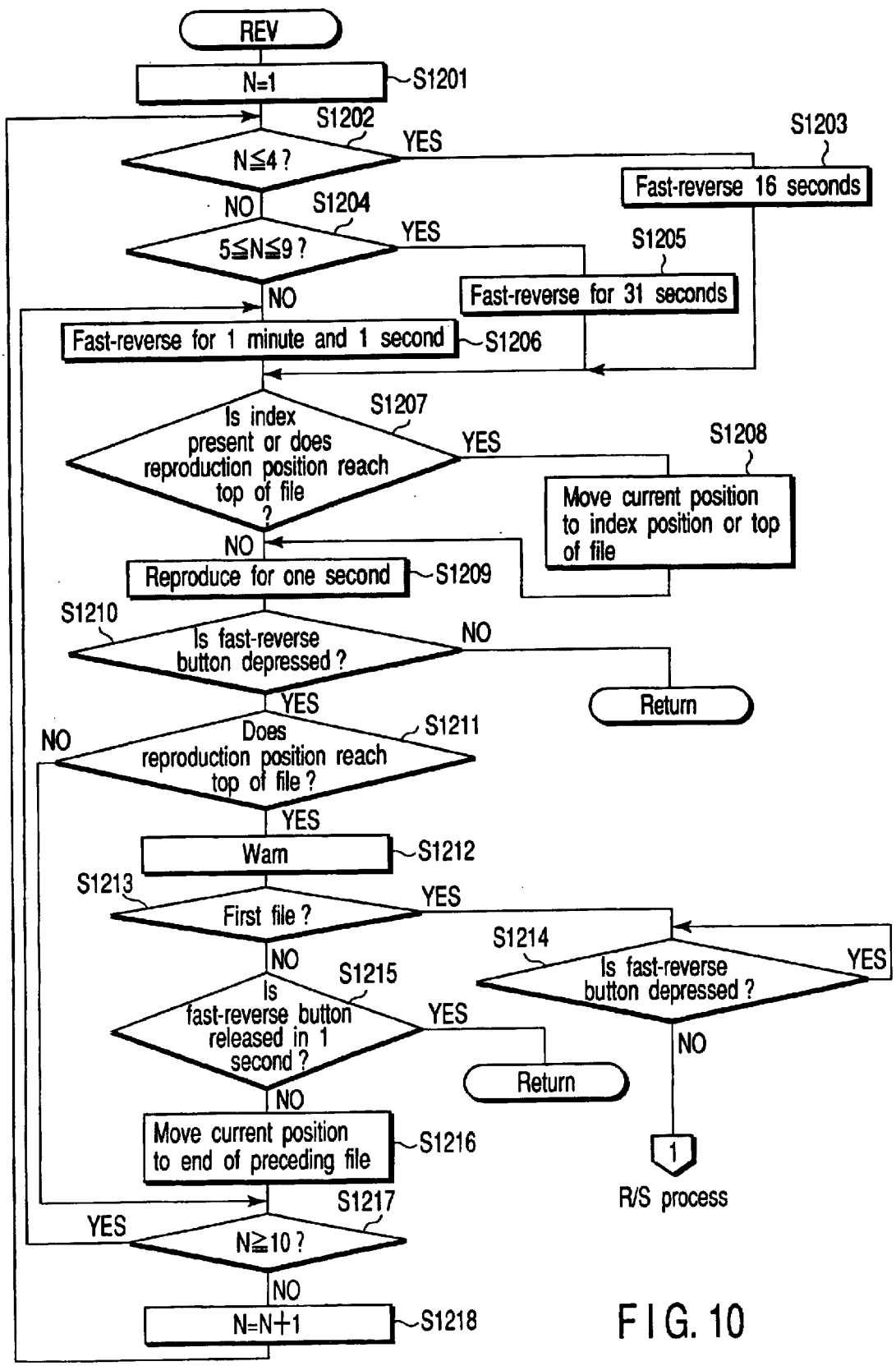
FIG. 10 is a flowchart of an REV process that is a fast-reverse reproduction process.

FIG. 10 is a flowchart showing an REV process as a fast-reverse reproduction process. First, 1 is set to the counter N (step S1201). Then, it is determined whether or not the value of counter N is 4 or less (step S1202). When it is determined that the value of counter N is 4 or less, the current position information of a file is reversed 16 seconds (step S1203), and the flow advances to step S1207.

If it is determined that the value is not 4 or less in step S1202, the flow advances to step S1204 to determine whether the value of counter N is 5 or more and 9 or less. When the value is 5 or more and 9 or less, the current position information of the file is reversed 31 seconds (step S1205), and the flow advances to step S1207.

If it is determined that the value is not 5 or more and 9 or less in step S1204, the current position information of the file is reversed one minute and one second (step S1206), and the flow advances to step S1207.

In step S1207, it is determined whether an index mark is added to a fast-reversed portion in step S1203, S1205 or S1206 or whether a reproduction position reaches the top of the file. If an index mark is added to the fast-reversed portion or the reproduction position reaches the top of the file, the current position information of the file is moved to the portion to which the index mark is added or the top of the file (step S1208).

Thereafter, a one-second file is reproduced from a portion corresponding to the current position information of the file (step S1209). If a given mute time is set in accordance with the amount of fast-reverse prior to the reproduction of the file, the operability is more improved. In this time, a 1.5x-speed reproduction can be performed. It is then determined whether the fast-reverse button 56 continues to be depressed or not (step S1210). If the fast-reverse button 56 is not depressed, the REV process ends.

If the fast-reverse button 56 continues to be depressed, it is determined whether the reproduction position reaches the top of the file under the REV process (step S1211). If the reproduction position reaches the top of the file, an alarm indicating that the position reaches the top of the file is issued from the speaker 63 (step S1212) to determine whether the file is the first one or its file number is one (step S1213).

If it is determined that the file is the first one, it is determined whether the fast-reverse button 56 continues to be depressed to wait until the depression of the fast-reverse button 56 is released (step S1214). When the depression of the fast-reverse button 56 is released, the process advances to the R/S process.

If it is determined that the file is not the first one, it is determined whether the depression of the fast-reverse button 56 is released within one second (step S1215). When the depression is released, the process returns to the original routine.

If the depression of the fast-reverse button 56 is not released within one second, the current position information of the file is moved to the end of a preceding file (step S1216), and the flow advances to step S1217.

If it is determined that the reproduction position does not reach the top of the file in step S1211, the flow advances to step S1217.

It is determined whether the value of counter N is 10 or more in step S1217. If the value of counter N is 10 or more, the flow returns to step S1206 and the above process is repeated. If not, the counter N is incremented (step S1218) and the flow returns to step S1202 and the above process is repeated.

Since the amount of fast-forward or fast-reverse is increased step by step by continuing to depress the fast-forward or fast-reverse button in the foregoing process, the process is very effective in retrieving information from the files. The counter is used in the first embodiment; however, the amount of fast-forward or fast-reverse can be increased depending on the duration of the depression. In the first embodiment, a so-called intermittent reproduction is performed as the fast-forward or fast-reverse reproduction. However, the speed of the reproduction itself can be increased and so can be the speed of reverse reproduction.

Figure 11:
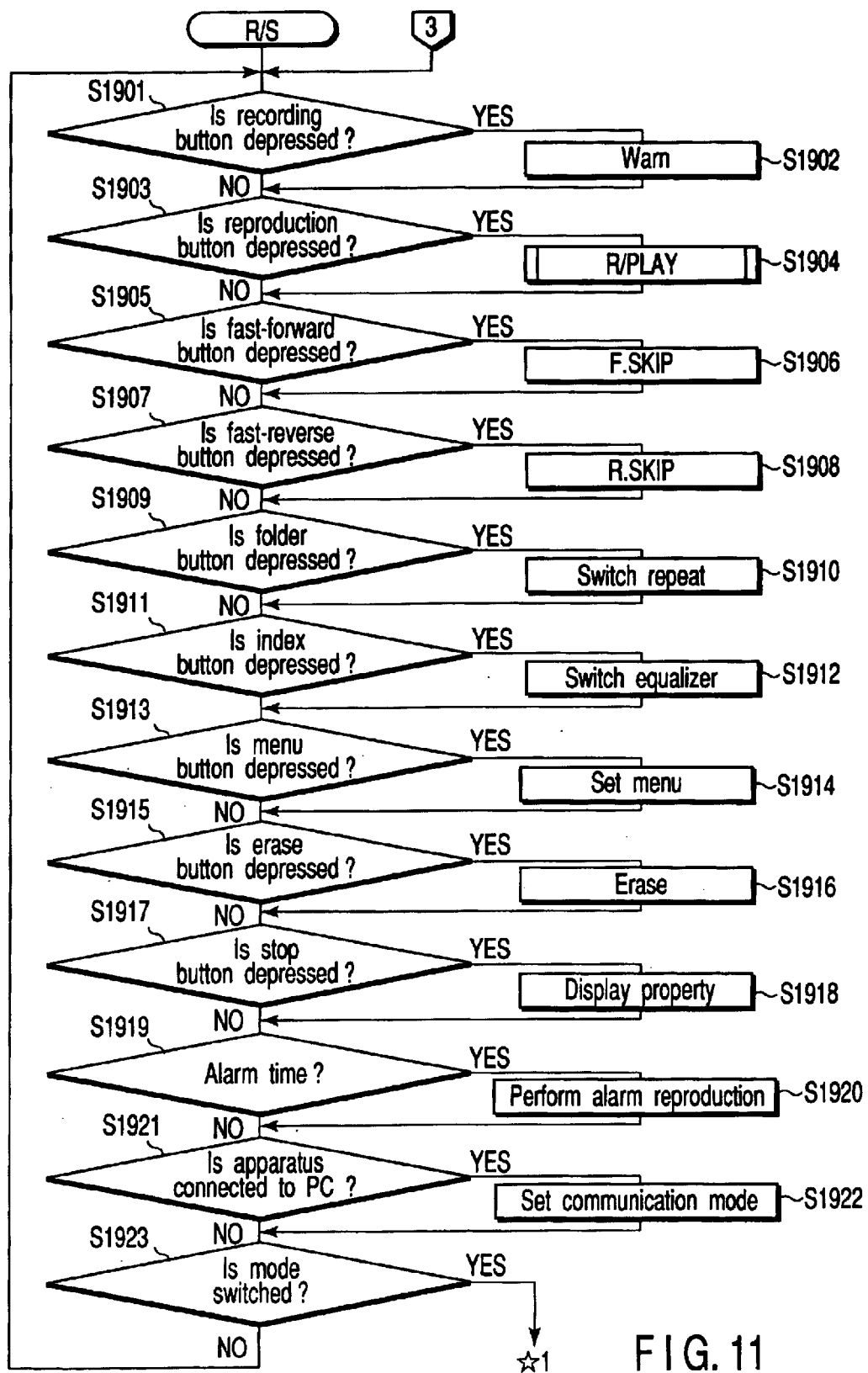
FIG. 11 is a flowchart showing a process executed when an operating mode is set in a player mode and the memory card 117 is inserted.

FIG. 11 is a flowchart showing a P/S process executed when the operating mode is set in the player mode and the memory card 117 is inserted.

First, it is determined whether the recording button 53 is depressed or not (step S1901). Since no voice can be recorded in the player mode, an alarm is issued from the speaker 63 in order to inform an operator that no voice can be recorded when the recording button 53 is depressed (step S1902).

When the recording button 53 is not depressed, the flow advances to step S1903 to determine whether the reproduction button 55 is depressed or not. When the reproduction button 55 is depressed, a P/PLAY process, which will be described in detail later, is executed (step S1904).

Since the process from step S1905 to step S1908 is the same as that from step S605 to step S608, its description is omitted.

If the fast-reverse button 56 is not depressed, the flow advances to step S1909 to determine whether the folder button 61 is depressed or not. The folder button 61 serves as a repeat mode select button in the player mode. Therefore, whenever the folder button 61 is depressed, it changes the repeat mode cyclically (step S1910).

When the folder button 61 is not depressed, the flow advances to step S1911 to determine whether the index button 59 is depressed or not (step S1911). The index button 59 serves as an equalizer (frequency response) select button in the player mode. Therefore, whenever the index button 59 is depressed, it changes the equalizer mode cyclically (step S1912).

When the index button 59 is not depressed, the flow advances to step S1913 to determine whether the menu button 60 is depressed or not. If the menu button 60 is depressed, a menu setting process is executed (step S1914) to make various settings about the player mode.

If the menu button 60 is not depressed, the flow advances to step S1915 to determine whether the erase button 58 is depressed or not. When the erase button 58 is depressed, an erase process is executed (step S1916) to erase a desired MP3 or WMA file.

If the erase button 58 is not depressed, the flow advances to step S1917 to determine whether the stop button 54 is depressed or not. When the stop button 54 is depressed, a property is displayed. More specifically, a coded algorithm of the current file and a bit rate are displayed on the main display 52 only when the stop button 54 is depressed. During halts, the reproduction number and the current position of a file are displayed.

If the stop button 54 is not depressed, the flow advances to step S1919 to determine whether alarm reproduction time comes or not. When it is determined that the alarm reproduction time comes, alarm reproduction, which will be described in detail later, is performed (step S1920).

If it is determined that the alarm reproduction time does not come, the flow advances to step S1921 to determine whether or not the apparatus is connected to a personal computer as an external device via a USB cable. When it is determined that the apparatus is connected to the personal computer, a communication mode is set to communicate with the personal computer (step S1922).

If it is determined that the apparatus is not connected to the personal computer, the flow moves to step S1923 to determine whether the operating mode switch 69 switches the operating mode. If it is determined that the operating mode switch 69 switches the mode, the flow returns to step S503 (FIG. 5). If not, the flow returns to step S1901.

Figure 12:
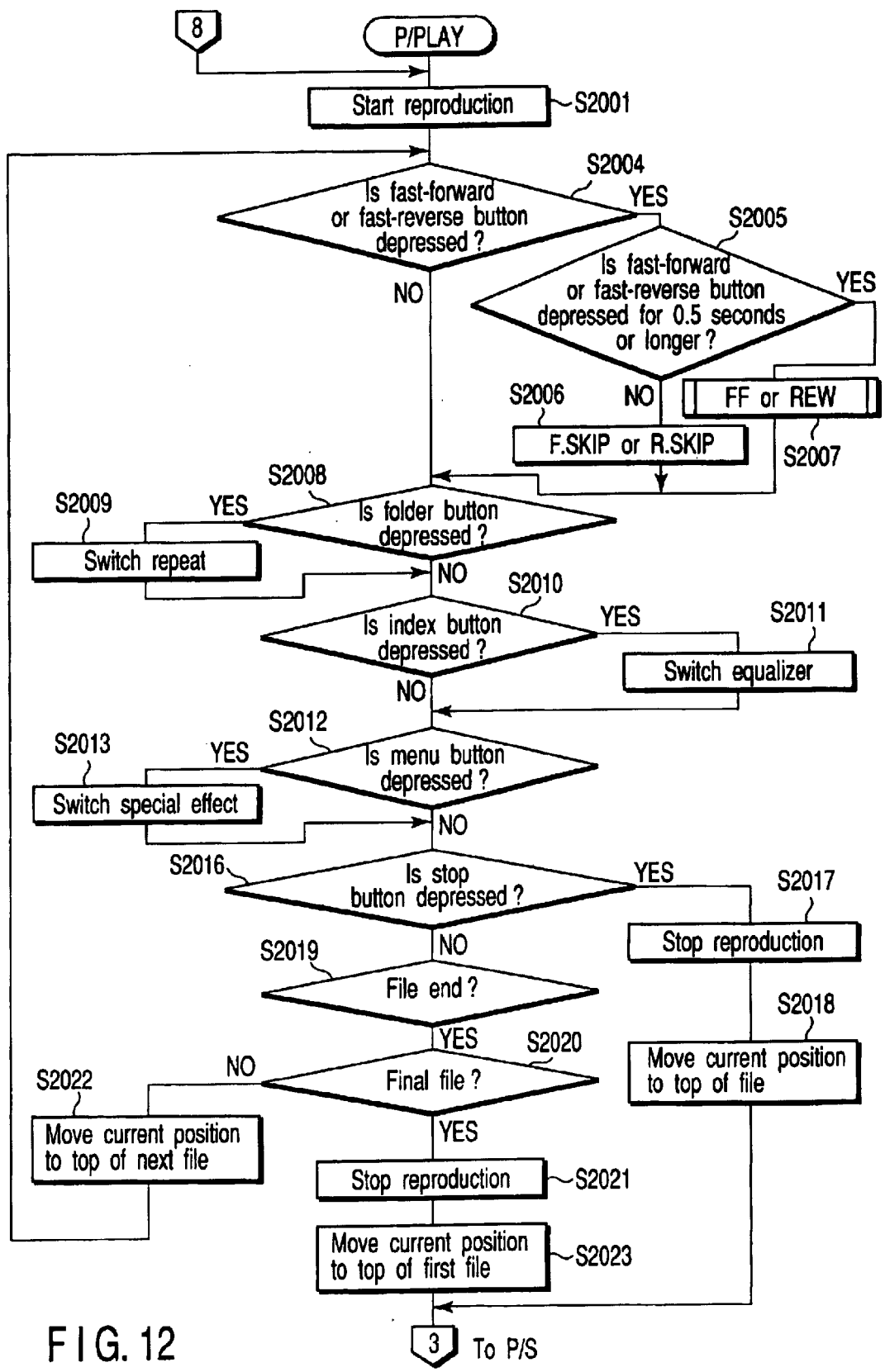
FIG. 12 is a flowchart of a P/PLAY process that is a reproduction process in the player mode.

FIG. 12 is a flowchart showing a P/PLAY process for performing a reproduction process when the operating mode is set in the player mode.

First, reproduction is started from the position of current position information of a file (step S200). In this step, information about the file to be reproduced, such as a singer's name and a song title, is displayed on the main display 52 for a given period of time after the file is reproduced and then the number of the file and the current position are displayed thereon.

It is determined whether the fast-forward button 57 or fast-reverse button 56 is depressed or not (step S2004). If it is determined that the fast-forward button 57 or fast-reverse button 56 is depressed, it is also determined whether its depression duration is 0.5 seconds or longer or not (step S2005).

If the depression duration is shorter than 0.5 seconds, a forward skip operation (F. SKIP) is performed when the fast-forward button 57 is depressed and a reverse skip operation (R. SKIP) is done when the fast-reverse button 56 is depressed (step S2006). If the duration is 0.5 seconds or longer, an FF process (described later) is performed when the fast-forward button 57 is depressed and an REW process (described later) is done when the fast-reverse button 56 is depressed (step S2007).

When one of the fast-forward and fast-reverse buttons 57 and 56 is not depressed in step S2004, it is determined whether folder button 61 is depressed or not (step S2008) (Step S2008). If it is determined that the folder 61 is depressed, the repeat mode is switched (step S2009) as in step S1910.

When the folder button 61 is not depressed, it is determined whether the index button 59 is depressed or not (step S2010). If it is determined that the index button 59 is depressed, the equalizer mode is switched (step S2011) as in step S1912.

When the index button 59 is not depressed, it is determined whether the menu button 50 is depressed or not (step S2012). The menu button 60 serves as a special effect switching button during the reproduction or pause of a file in the player mode. It is thus possible to make surround-sound and bass amplification settings when the menu button 60 is depressed. These two settings can be made in six levels from 0 to 5 by operating the fast-forward button 57 and fast-reverse button 56. The reproduction or pause is continued during the setting (step S2013).

When the menu button 60 is not depressed, it is determined whether the stop button 54 is depressed or not (step S2016). If the stop button 54 is depressed, a reproduction operation (including a pause) is stopped (step S2017) and the current position information of the file is moved to the top of the file under reproduction (step S2018). Thus, the P/PLAY process ends and shifts to the P/S process.

When the stop button 54 is not depressed, it is determined whether the reproduction reaches the end of the file under reproduction (step S2019). If the reproduction reaches the end of the file, it is determined whether the file whose reproduction is completed is the final one in the player mode (step S2020). If not, the current position information of the file is moved to the top of the next file (step S2022) and then the flow returns to step S2002. If the file is the final one, the reproduction operation (including a pause) is stopped (step S2021). Then, the current position information of the file is moved to the top of the first file in the player mode (step S2023) and the P/PLAY process shifts to the P/S process.

When it is determined that the reproduction does not reach the end of the file in step S2019, the flow returns to step S2002 and the above process is repeated.

Figure 13:
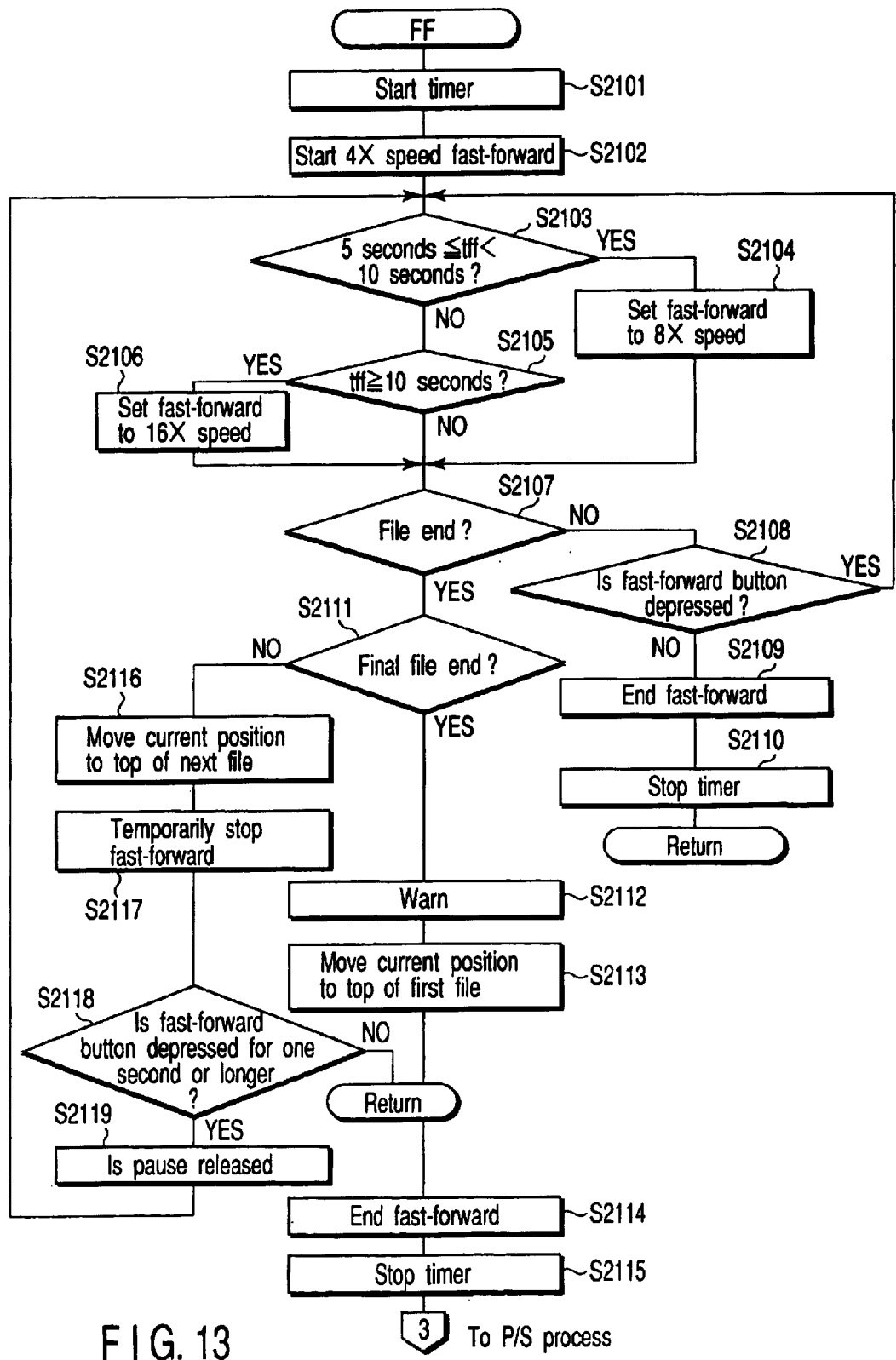
FIG. 13 is a flowchart of an FF process for performing a fast-forward operation.

FIG. 13 is a flowchart showing an FF process for performing a fast-forward operation. In the fast-forward process in the player mode, the current position information of a file is moved during the fast-forward but no sound is reproduced, unlike in the CUE process in the recorder mode.

First, a timer tff is started to measure time elapsed after a fast-forward process starts (step S2101). During the reproduction of a file, the output of a reproduced sound is stopped and the fast-forward of the current position information of the file is started at speed four times as high as the normal reproduction speed (step S2102).

It is then determined whether the value of timer tff is 5 seconds or longer and shorter than 10 seconds (step S2103). If the value of timer tff is 5 seconds or longer and shorter than 10 seconds, the speed of fast-forward is changed to an 8× speed (step S2104). If not, the flow advances to step S2105 to determine whether the value of timer tff is 10 seconds or longer. If it is determined whether the value is 10 seconds or longer, the speed of fast-forward is changed to a 16× speed (step S2106). If not, the flow advances to step S2107. Thus, the speed of fast-forward is changed in accordance with the time elapsed after the fast-forward process starts.

Then, it is determined whether fast-forward reaches the end of the current file or not (step S2107). If not, it is determined whether the fast-forward button 57 continues to be depressed (step S2108). When it is determined that the fast-forward button is not depressed, the fast-forward ends (step S2109), and the output of a reproduced sound is restarted from the position of the fast-forward to stop the timer tff (step S2110), and the flow returns. When the fast-forward button 57 continues to be depressed, the flow returns to step S2103.

When it is determined that the fast-forward reaches the end of the current file in step S2107, it is determined whether the current file is the final one or not (step S2111). If it is determined that the current file is the final one, an alarm indicating that it is the final one is issued from the speaker 63 (step S2112), and the current position information of the file is moved to the top of the first file (step S2113). The fast-forward operation ends (step S2114) and the timer ttf stops (step S2115). The FF process shifts to the P/S process.

When it is determined that the current file is not the final one in step S2111, the current position information of the file is moved to the top of the next file (step S2116) and the fast-forward operation stops temporally (step S2117). It is then determined whether the fast-forward button 57 continues to be depressed for one second (step S2118). When the depression of the fast-forward button is released in shorter than one second, the fast-forward operation ends and the flow returns.

When it is determined that the fast-forward button continues to be depressed for one second or longer, the pause of the fast-forward operation is released and the fast-forward operation restarts from the top of the next file at the same speed as that of the operation before it stops temporarily (step S2119). The flow returns to step S2103 and the above operation is repeated.

Figure 14:
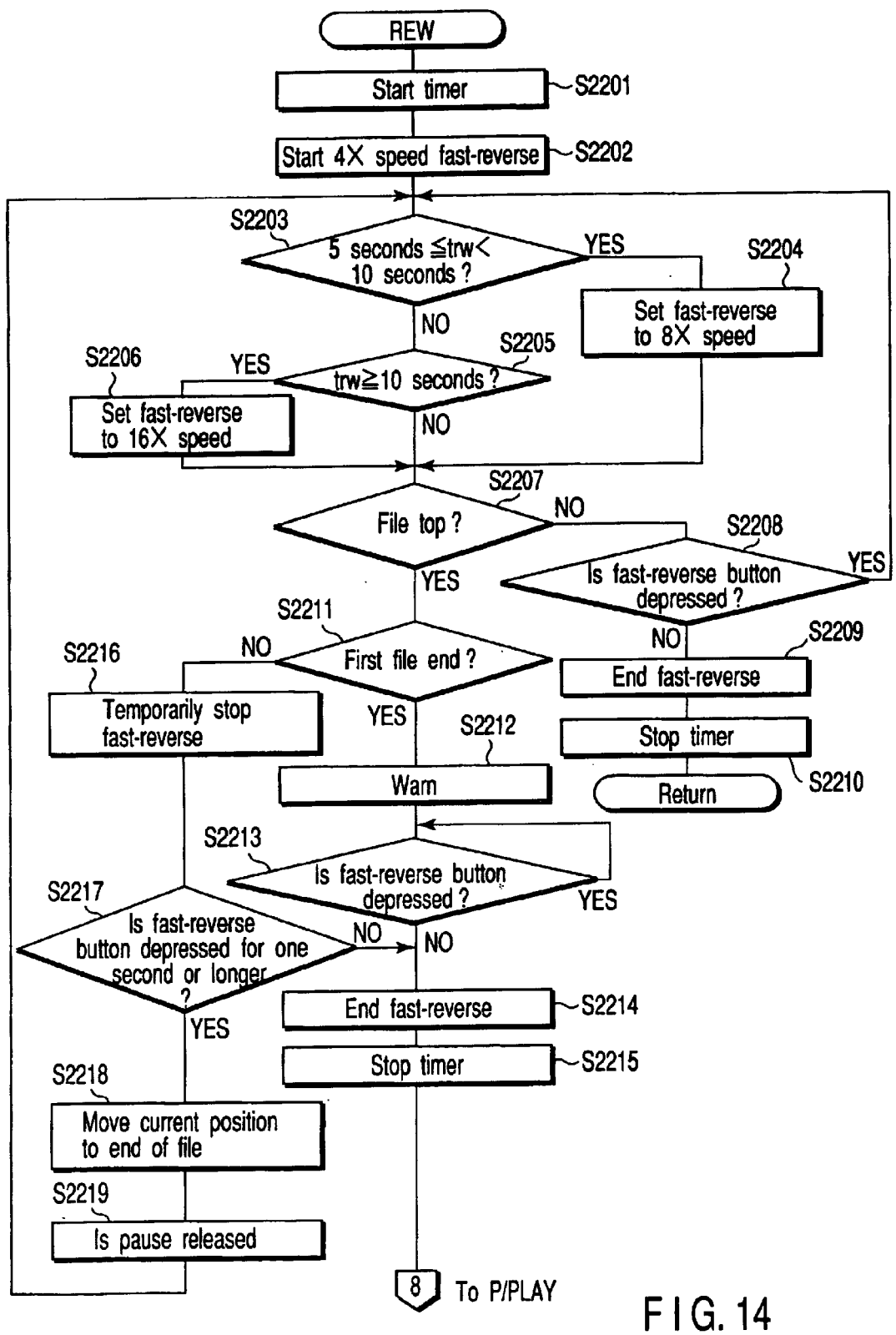
FIG. 14 is a flowchart of an REW process for performing a fast-reverse operation.

FIG. 14 is a flowchart showing an REW process for performing a fast-reverse operation. In the fast-reverse process in the player mode, the current position information of a file is moved during the fast-reverse but no sound is reproduced, unlike in the REV process in the recorder mode. The descriptions of the process from step S2201 to step S2210 are omitted because the timer tff, fast-forward, and file end can be read as timer trw for measuring time elapsed after the fast-reverse process starts, fast-reverse, and file top, respectively.

When it is determined that the fast-reverse reaches the top of the current file in step S2207, it is determined whether the current file is the first one or not (step S2211). If it is determined that the current file is the first one, an alarm indicating that it is the first one is issued from the speaker 63 (step S2212) to wait for the release of depression of fast-reverse button 56 (step S2213). When the depression of fast-reverse button 56 is released, the fast-reverse operation ends (step S2214) and the timer trw stops (step S2115). The REW process shifts to the P/PLAY process to start reproduction from the position in which the fast-reverse operation ends.

When it is determined that the current file is not the first one in step S2211, the fast-reverse operation stops temporarily (step S2216). It is then determined whether the fast-reverse button 56 continues to be depressed for one second (step S2217). When the depression of the fast-reverse button 56 is released in shorter than one second, the flow moves to the foregoing step S2114 to end the fast-reverse operation.

When it is determined that the fast-reverse button continues to be depressed for one second or longer, the current position information of the file is moved to the end of the preceding file (step S2218) and the pause of the fast-reverse operation is released. The fast-reverse operation restarts from the end of the file at the same speed as that of the operation before it stops temporarily (step S2219). The flow returns to step 2203 and the above operation is repeated.

An alarm reproduction process will now be described in detail with reference to the flowchart shown in FIG. 15 and the contents displayed on the main display 52 shown in FIGS. 16 to 20.

Figure 16:
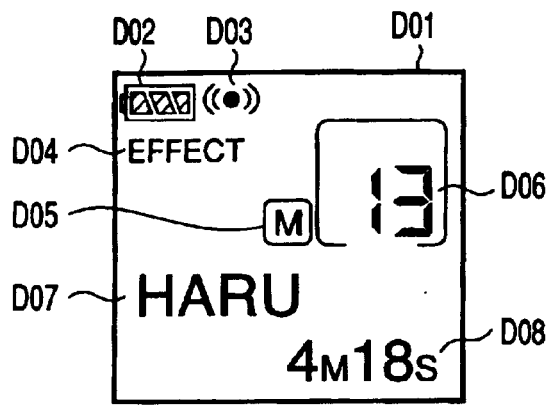
FIG. 16 is a diagram showing a display in which reproduction is stopped when the memory card 117 is inserted in the player mode.

FIG. 16 shows a display in which reproduction is stopped when the memory card 117 is inserted in the player mode. A display screen D01 displays various items of information about the voice recording and reproducing apparatus. A battery remaining amount display D02 shows the state of a battery serving as an internal power supply of the voice recording and reproducing apparatus.

An alarm setting display D03 shows a so-called alarm function of issuing an alarm from the speaker 63 at the operator's preset time or alarm reproduction.

A special effect display D04 shows some special effects such as a surround-sound effect and a bass amplification effect.

A mode/folder display D05 shows a recorder mode or a player mode as the operating mode. The display also shows which of folders A, B and C is the current folder in the recorder mode.

A file number display D06 shows a file number of the current file.

A song tile display D07 shows song title information of the current file, which is stored in the current file. A current position display D08 shows the current stop position from the top of the file.

The alarm reproduction process that is performed from the state shown in FIG. 16 will now be described in line with the flowchart shown in FIG. 15. The alarm reproduction process is executed when alarm reproduction time comes during the R/S process shown in FIG. 6 and the P/S process shown in FIG. 11.

First, an alarm starts to issue from the speaker 63 (step S1301). Then, it is determined whether a file targeted for alarm reproduction can be reproduced in the player mode or in the recorder mode, or the type of a file targeted for alarm reproduction is determined. The current operating mode is determined, and it is determined whether the operating mode should be switched in order to reproduce the file targeted for alarm reproduction (step S1302).

Figure 17:
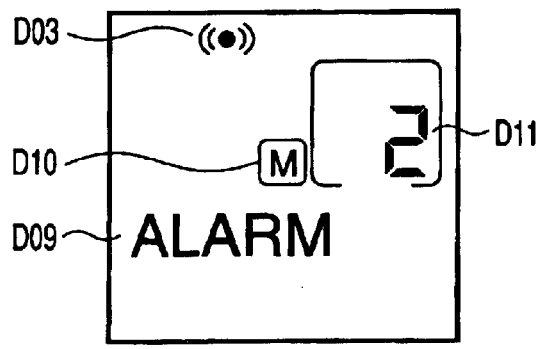
FIG. 17 is a diagram showing a display of normal alarm.

If it is determined that the current operating mode need not be switched when the operating mode is set in the player mode and the file targeted for alarm reproduction is an MP3 or WMA file, a normal alarm display as shown in FIG. 17 is made.

In FIG. 17, an alarm display D09 shows that alarm set time has come. Both a mode/folder display D10 and a file number display D11 show which is an alarm reproduction setting file. While an alarm is issuing, these displays and alarm setting display D03 blink at the same time.

Figure 15:
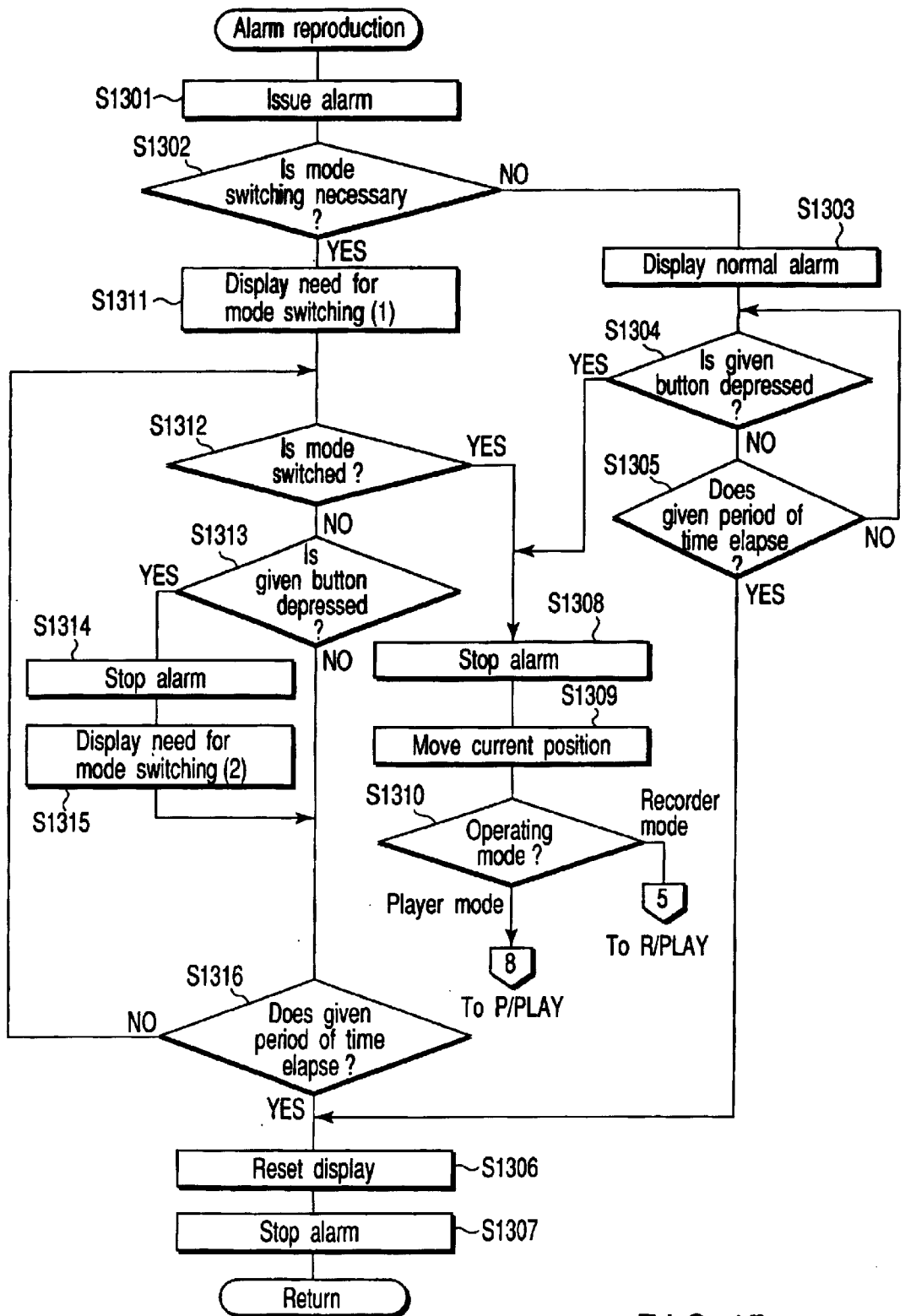
FIG. 15 is a flowchart showing an alarm reproduction process.

Returning to the flowchart shown in FIG. 15, it is determined whether a given button is depressed or not (step S1304). The given button means an operation button provided on the front of the main body 51, such as the recording button 53 and the stop button 54 and an operation button provided on that side of the main body 51 on which the reproduction button 55 is arranged.

In consideration of various reasons, however, either the operation button provided on the front of the main body 51 or the operation button provided on one side of the main body 51 can be used as the given button. Further, only a specific button can be chosen from these buttons as the given button.

When the given button is not depressed in step S1304, it is determined whether a given period of time elapses after the alarm reproduction process starts (step S1305). In the first embodiment, the period of time is set at 10 minutes; however, it has only to be decided in consideration of various reasons. If it is determined that the given period of time does not elapse, the flow returns to step S1304. In other words, the given button is depressed in the given period of time or the steps S1304 and S1305 are repeated until the given period of time elapses. When the given button is not depressed but a given period of time elapses, the display is reset (step S1306), and the alarm is stopped (step S1307). The alarm reproduction process ends.

When the given button is depressed in a given period of time, the alarm is stopped (step S1308) and the current position information of the file is moved to the top of the file targeted for alarm reproduction (step S1309). When the current operating mode is set in the recorder mode, the flow advances to step S901 shown in FIG. 7 to execute a reproduction process. When the current operating mode is set in the player mode, the flow goes to step S2001 to execute a reproduction process.

Figure 18:
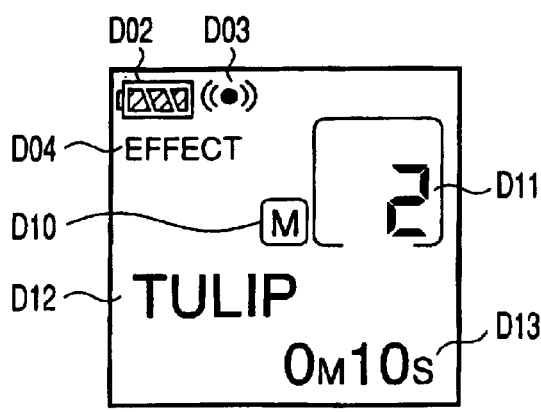
FIG. 18 is a diagram showing a display of alarm reproduction in the player mode.

FIG. 18 shows a display screen in which alarm reproduction is performed in the player mode. A song title display D12 and the current position display D13 are shown in addition to a mode/folder display D10 and a file number display D11.

During the alarm reproduction, the display D03 blinks in order to distinguish the alarm reproduction from the normal reproduction.

Figure 19:
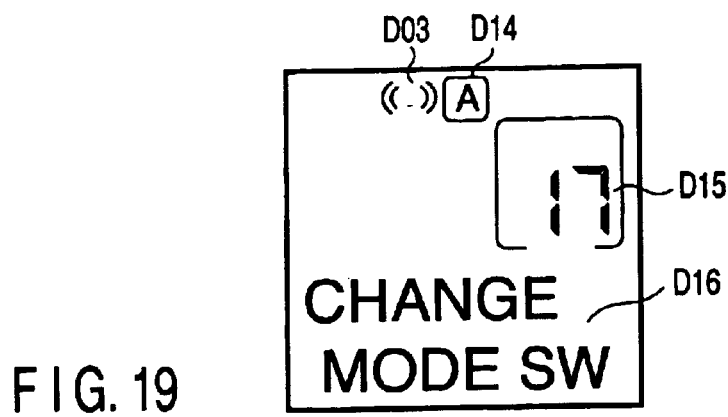
FIG. 19 is a diagram showing a display showing that an operating mode should be changed.

When it is determined that the operating mode should be switched in step S1302, the need for switching the operating mode is displayed as shown in FIG. 19 (step S1311).

In FIG. 19, a mode/folder display D14 shows that a file targeted for alarm reproduction is stored in folder A that can be used in the recorder mode. A file number display D15 shows a file number of a file targeted for alarm reproduction in folder A. Further, a mode switch request display D16 shows the need for switching a mode. These displays blink at the same time.

Returning to the flowchart shown in FIG. 15, it is determined whether the operating mode is switched or not (step S1312). When the operating mode is switched, the display is restored to the normal display and the flow goes to step S1308 to perform the foregoing process.

Figure 20:
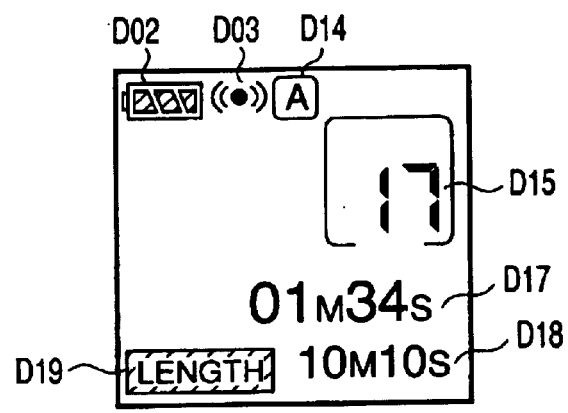
FIG. 20 is a diagram showing a display of reproduction of a file of folder A whose file number is 17.

FIG. 20 shows a display in which a file having file number 17 in folder A is reproduced. In the recorder mode, a current position display D17 is made in the position of the song tile display in the player mode and a file length display D18 is made thereunder unlike in the player mode. A display D19 is made on the left side of display D18 in order to show that the lower numeric value indicates a file length.

When the operating mode is not switched in step S1312, it is determined whether a given button is depressed or not (step S1313). Since the given button is the same as that in step S1304, its description is omitted.

When the given button is depressed, the alarm is stopped (step S1314). Since, however, the mode is not switched, the file targeted for alarm reproduction cannot be reproduced yet in this state. Therefore, the need for switching the operating mode is displayed in the form different from that of the display in step S1311.

More specifically, the alarm setting display D03, mode/folder display D14, and file number display D15 are switched from blink display to illumination display and only the mode switch display D16 blinks on the screen shown in FIG. 19. This makes an operator aware of the need for switching the mode (step S1315).

When the given button is not depressed, it is determined whether a given period of time elapses after the alarm reproduction process starts. This process is the same as that in step S1305 (step S1316). If the given period of time does not elapse, the flow returns to step S1312 and the above process is repeated. If the given period of time elapses, the flow advances to steps S1306 and S1307 and the alarm reproduction process ends.

Figure 22:
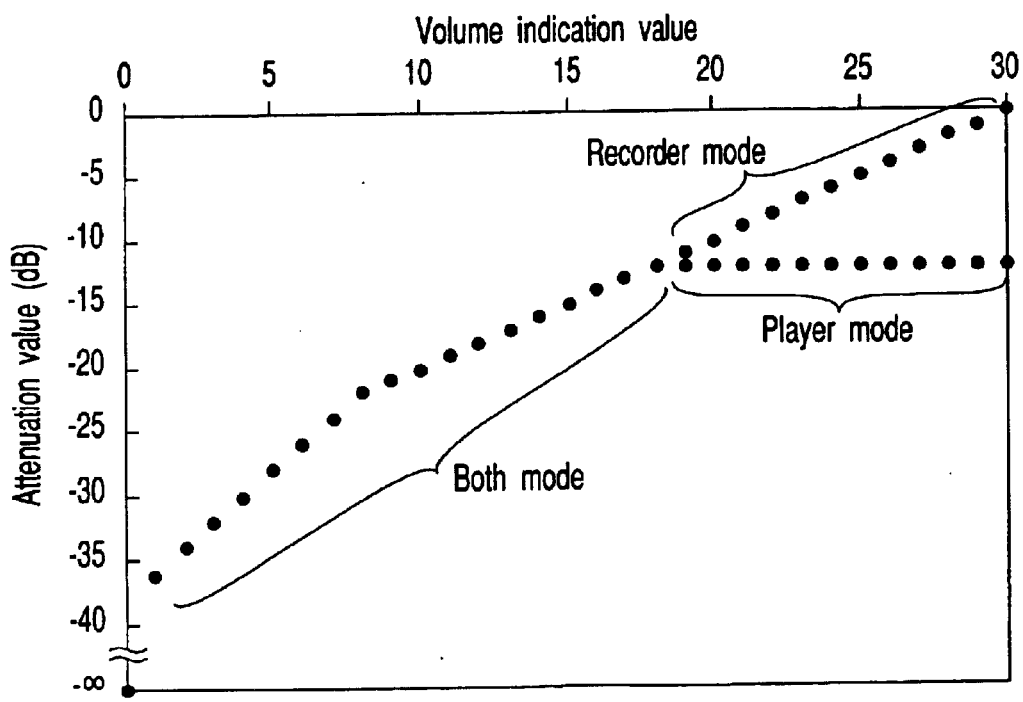
FIG. 22 is a graph corresponding to the table shown in FIG. 21.

FIG. 21 shows a reproduction level adjustment table of the voice recording and reproducing apparatus. FIG. 22 shows a graph corresponding to the table shown in FIG. 21.

In the voice recording and reproducing apparatus, the maximum reproduction level of the player mode can be adjusted. In the reproduction level adjustment table, an index value indicates a value of an index displayed on the volume control 67. A volume indication value is a value into which the CPU 16 analog-to-digital-converts an output of the volume controller 25. A set attenuation value is a value indicating how much the level (or maximum signal level) of reference signals output from the output amplifiers 5g and 5h is attenuated. The set attenuation value depends upon both the volume indication value read by the CPU 16 and the operating mode. The reproduction level adjustment table shows a case where the maximum reproduction level of the player mode is 6 in terms of the index value of the volume control 67, 18 in terms of the volume indication value, and −12 dB in terms of the set attenuation value.

First, the reproduction level adjustment in the recorder mode will be described.

When the volume control 67 is turned to the minimum volume side, the volume indication value is 0 and the set attenuation value is −∞. In other words, no sound is produced from the headphone terminals or speaker 63. If the volume control 67 is turned in this state, the set attenuation value increases by 2 dB every time the volume indication value increases by one when the index value ranges from 0 to 3 and the volume indication value ranges from 1 to 8. If the volume control 67 is turned further, the set attenuation value increases by 1 dB every time the volume indication value increases by one. When the volume indication value reaches 30, a sound is produced without attenuating any reference signals.

If the volume control 69 is operated as described above in the recorder mode, the output of sound varies with the operation of the volume control within almost all the range.

Then, the reproduction level adjustment in the player mode will be described.

The same process as that in the above recorder mode is performed when the volume set value ranges from 0 to 18. In the player mode, the maximum reproduction level is set at 6 in terms of the index value of the volume control 67, 18 in terms of the volume indication value, and −12 dB in terms of the set attenuation value. Therefore, even though the volume control 67 is turned such that the index value exceeds 6, the set attenuation value is constant at −12 dB. The backlight of the main display 52 can blink or "VOL MAX" can light or blink on the main display 52 in order to notify an operator that the maximum reproduction level is restricted within the range where the index value ranges from 6 to 10, the volume indication value ranges from 19 to 30, or the set attenuation value is −12 dB in FIGS. 21 and 22.

If an appropriate maximum reproduction level is set, when a user records the contents of a meeting in the recorder mode and then listens to music in the player mode at a higher reproduction level, the music can be prevented from being reproduced at a reproduction level higher than required.

Figure 23:
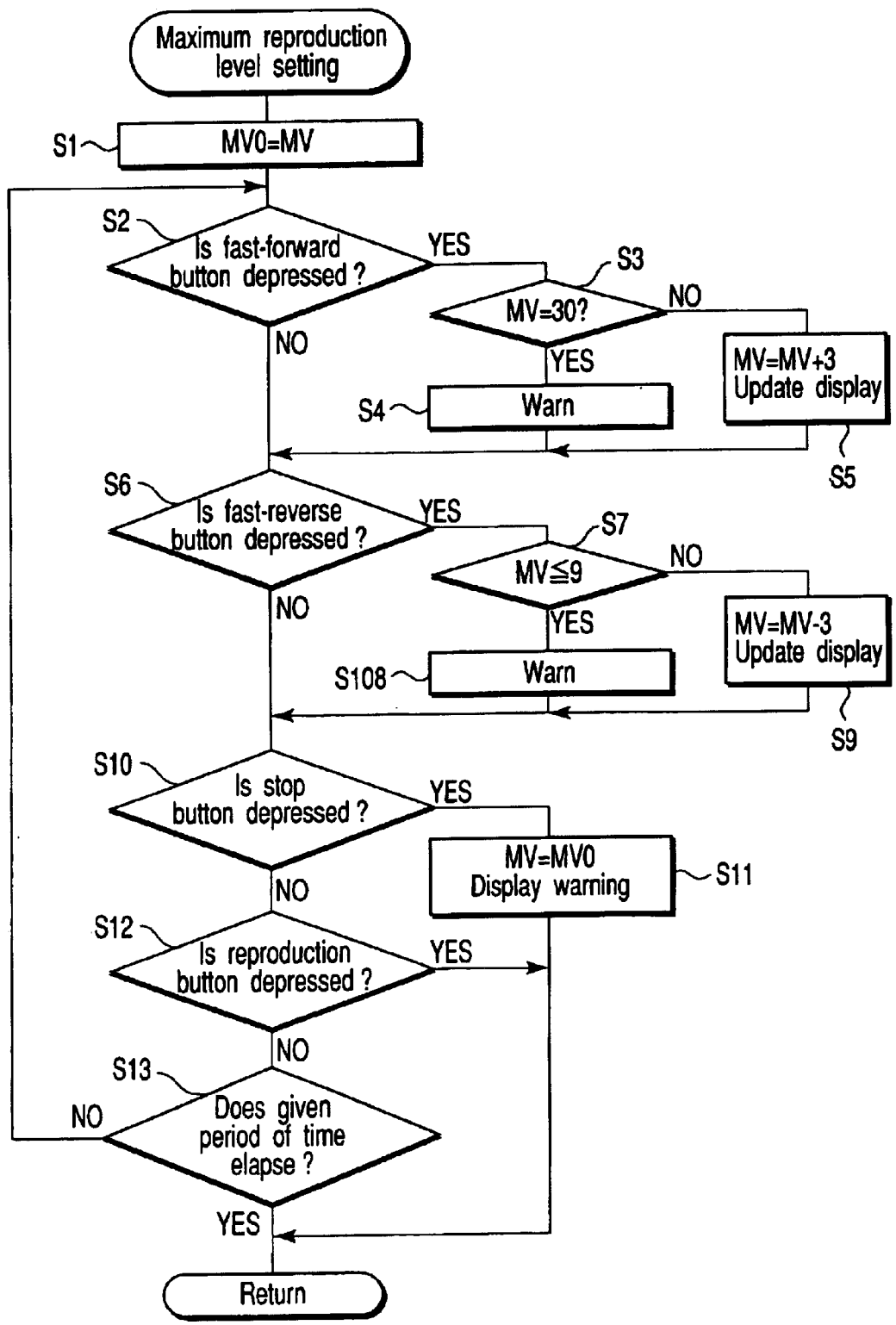
FIG. 23 is a flowchart for explaining an operation of setting the maximum reproduction level by the voice recording and reproducing apparatus.

An operation of setting the maximum reproduction level in the voice recording and reproducing apparatus according to the first embodiment will now be described in detail with reference to the flowchart shown in FIG. 23.

The setting of the maximum reproduction level is performed by selecting an item of setting of the maximum reproduction level from the menu setting process in step S1914 of the P/S process.

When the maximum reproduction level setting process starts, the currently-set maximum volume indication value MV (by which the maximum volume is determined and which corresponds to the foregoing volume indication value) is temporarily stored in MV0 (step S1). Then, it is determined whether the fast-forward button 57 is depressed or not (step S2).

When the fast-forward button 57 is depressed, it is determined whether the currently-set maximum volume indication value MV reaches 30 or not (step S3).

When the maximum volume indication value MV is 30, an alarm or a display showing that the maximum reproduction level cannot be increased any more is given to an operator since the upper limit of the volume indication value is 30 (step S4).

When the maximum volume indication value MV is not 30, the current maximum volume indication value MV is increased three by three to update the display of the maximum reproduction level (step S5). The maximum reproduction level is displayed in accordance with not the volume set value but the index value of the volume control 67. In this case, the value displayed on the main display 52 is "6". This idea allows the correspondence between the maximum reproduction level and the display of the volume control 67 and thus the operator is easy to operate the apparatus. This is because the maximum volume indication value MV is increased three by three first.

In order to adjust the maximum volume more finely, the volume indication values are used for display or not numeric values but bar graphs or the like can be used as analog display.

When the fast-reverse button 56 is not depressed in step S2, it is determined whether the fast-reverse button 56 is depressed or not (step S6).

When the fast-reverse button 56 is depressed, it is determined whether the maximum volume indication value MV is 9 or less (step S7).

If the maximum volume indication value MV is set at a very small value, an operator cannot increase a reproduction level even though he or she wishes to do so, with the result that the operability is often likely to lower. In this embodiment, therefore, the maximum volume indication value MV is inhibited from being set at 8 or less. Consequently, when the maximum volume indication value MV is 9 or less, a warning that the maximum reproduction level cannot be lowered any more is given by an alarm and a display (step S8). If such consideration is not required, it has only to be determined whether the maximum volume indication value MV is 0 or less. Thus, the maximum volume indication value MV can be set within the whole range.

When the maximum volume indication value MV is not 9 or less in step S7, the maximum volume indication value MV is decreased three by three (step S9). Since an indicating light is substantially the same as that in step S5 described above, its description is omitted.

When the fast-reverse button 56 is not depressed in step S6, it is determined whether the stop button 54 is depressed or not (step S10).

The stop button 54 serves as a cancel button. If, therefore, it is determined that the stop button 54 is depressed, the maximum volume indication value MV changed in the above steps S2 to S9 is cancelled and restored to the original maximum volume indication value MV0 stored in step S1 (step S11). The present routine ends and the process returns to the original routine.

When the stop button 54 is not depressed, it is determined whether the reproduction button 55 is depressed or not (step S12). Since the reproduction button 55 serves as a confirmation button, the maximum volume indication value MV changed in the above steps S2 to S9 is effective. Thus, the present routine ends and the process returns to the original routine.

When the reproduction button 55 is not depressed in step S12, it is determined whether a given period of time elapses after the operation button is last operated (step S13). Specifically, the given period of time is considered to be about 10 seconds. The given period of time is not limited to the numeric value. It is needless to say that it can be set appropriately in consideration of other circumstances such as operability.

When it is determined that the given period of time does not elapse, the flow returns to step S2 and the above process is repeated.

The first embodiment of the present invention has been described. The present invention is not limited to the embodiment. Needless to say, various modifications and changes can be made without departing from the scope of the subject matter of the present invention. In the foregoing embodiment, the maximum reproduction level is set in the player mode. However, the present invention is effective even in a voice recording/reproducing apparatus having no concepts of an operating mode if there is a possibility that a reproduction level of data will be relatively higher than that of other data when the former data is reproduced. For example, when such a possibility is raised by the coding scheme of data to be reproduced, the maximum reproduction level can be set in accordance with the coding scheme. Further, when the above problem is caused in accordance with folders in which data to be reproduced is stored, the maximum reproduction level can be set in each of the folders. The maximum reproduction level can also be set by checking a file header of data to be reproduced and detecting the attribute of the data to be reproduced.

(Second Embodiment)

According to the foregoing first embodiment, when the recording button 53 is depressed in the player mode, only the alarm is issued. In the second embodiment, however, recording can be performed in this case.

Figure 24:
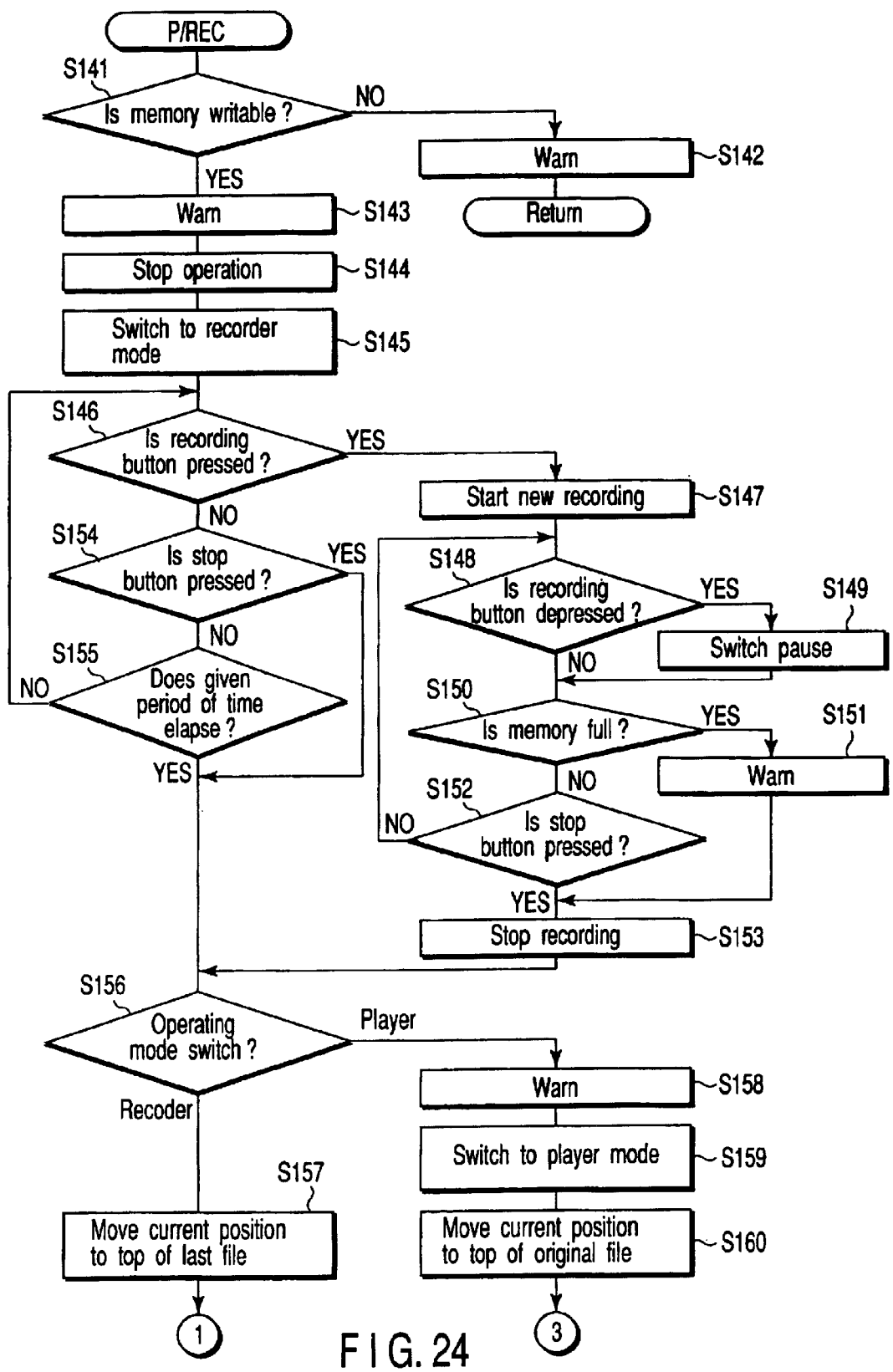
FIG. 24 is a flowchart explaining a P/REC process that is executed when a recording button 53 is depressed in the player mode in a second embodiment of the present invention.

FIG. 24 is a flowchart explaining a P/REC process that is executed when the recording button 53 is depressed in the player mode.

The P/REC process is executed when no operation is performed in the player mode or when no operation is performed by an operating button or the like or when the recording button 53 is depressed during the reproduction of a voice file in the player mode.

First, in step S141, it is determined whether a memory card 117 is writable or not or whether it is write-protected or whether the memory card 117 has a recordable space. When the memory card is not writable, the flow advances to step S142, in which an alarm is issued from the speaker 63 and a warning thereof is displayed. After that, the flow goes out of the present routine. While a voice file is being reproduced in this time, the process is continued without particularly stopping the reproduction.

When it is determined that the memory card 117 is writable in step S141, the flow goes to step S143, in which the operating mode is switched to the recorder mode and a warning that the card is recordable is given. More specifically, an alarm is output from the speaker 63 and a display showing that the operating mode is switched to the recorder mode is made on the main display 52.

After that, when an operation such as reproduction of a voice file is performed, the flow shifts to step S144 to stop the operation. In step S145, the operating mode is switched from the player mode to the recorder mode and then a file number that is newly added when the recording button 53 is depressed is displayed. In the second embodiment, a new file is added to the last file of a given folder (referred to as folder A).

In step S146, it is determined whether the recording button 53 is depressed again. When it is determined that the recording button 53 is depressed again, the flow goes to step S147, in which voice data starts to be recorded in DSS format with the file number described above. The values preset in the recorder mode are used as they are for various settings such as the sensitivity of the mike and the recording mode.

After recording is newly started, it is determined whether the recording button 53 is depressed again in step S148. When it is determined that the recording button 53 is depressed again, the flow advances to step S149. If a voice recording process is performed in this state, it stops temporarily. If the voice recording process stops temporarily, an operation of releasing the temporal stop is performed.

When it is determined that the recording button 53 is not depressed again in step S148, the flow moves to step S150 to determine whether the memory card 117 sill has a space area. If it is determined that the memory card 117 has no spare area, the flow goes to step S151, in which an alarm is issued and a warning thereof is displayed.

On the other hand, when it is determined that the memory card still has a space area in step S150, the flow advances to step S152 to determine whether the stop button 54 is depressed or not. When it is determined that the stop button 54 is not depressed, the flow goes to step S148 and the above process is repeated.

When the stop button 54 is depressed in step S152 and after a warning is displayed in step S151, the flow goes to step S153 to stop a new recording operation.

When it is determined that the recording button 53 is not depressed in step S146, the flow goes to step S154 to determine whether the stop button 54 is depressed. In step S155, it is determined whether a given period of time elapses after the recording button 53 is depressed first or the P/REC process is started.

When the stop button 54 is not depressed or the given period of time does not elapse, the flow goes to step S146 to repeatedly determine whether the recording button 53 is depressed. In contrast, when the new recording operation is stopped or the stop button 54 is depressed in step S154 or a given period of time has elapsed in step S115, the flow goes to step S156 to determine the state of the operating mode switch 69.

When the operating mode switch 69 is located in the position of the recorder mode in step S156, the flow goes to step S157 and the current position information of a file is moved to the top of the last file of a given folder. If a new file is recorded, it is the last one; therefore, the current position information is moved to the top of the new file. The P/REC process ends and then the flow goes to the R/S process (step S601 in the flowchart shown in FIG. 6).

When the operating mode switch 69 is set in the player mode, the flow goes to step S158, in which an alarm showing that the operating mode is restored to the player mode is issued and a warning thereof is displayed. Then, the operating mode is switched to the player mode in step S159.

In step S160, the current position of the file is moved to the top of the original file before the P/REC process is started, and the flow shifts to step S1901 of the flowchart shown in FIG. 11.

In the second embodiment, since an operating mode is set by the operating mode switch 69, the state is discriminated to determine an operating mode after completion of recording, thereby preventing a mismatch from occurring between the position of the operating mode switch 69 and the actual operating mode after the P/REC process. However, in order to set the operating mode, not a slide switch as in the second embodiment but a push button switch can be used. The operating mode can be set in accordance with the number of depressions of the push button switch. In this case, the operating mode can be restored to the original player mode without any determination as performed in step S156 or the recorder mode can be continued.

In the second embodiment, a new file is added to the last file of folder A. The present invention is not limited to this. For example it can be added to the last file of folder C. If a user can define a menu setting by himself or herself, he or she can easily operate the apparatus.

If it is determined where voice data is stored after it is recorded, the voice data can be put in a desired folder as determined.

(Third Embodiment)

The third embodiment of the present invention is another embodiment directed to the alarm reproduction process.

Figure 25:
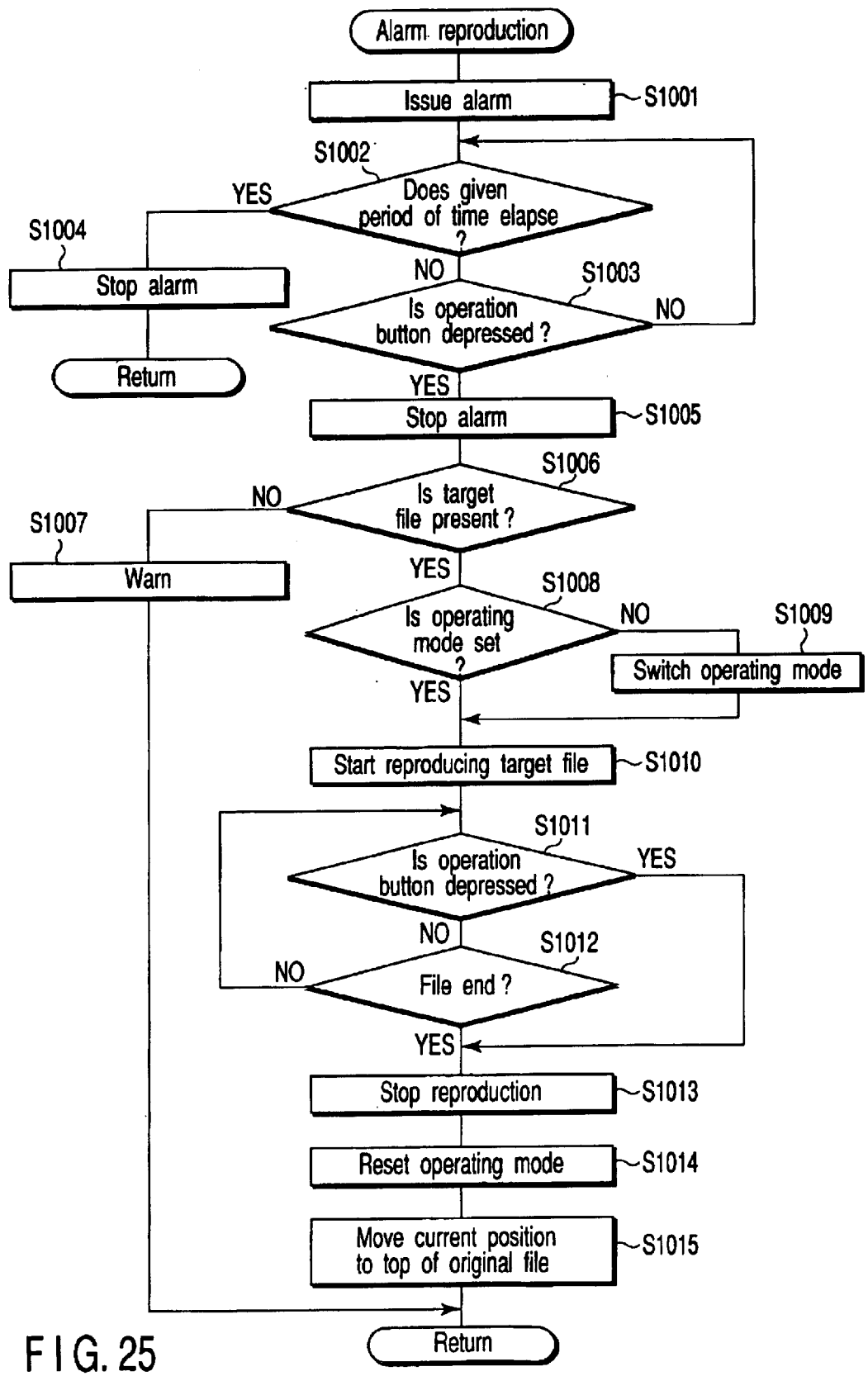
FIG. 25 is a flowchart showing an alarm reproduction process in a third embodiment of the present invention.

FIG. 25 is a flowchart showing an alarm reproduction process. The alarm reproduction process is executed when alarm reproduction time comes during the R/S process shown in FIG. 6 and the P/S process shown in FIG. 11.

First, an alarm is issued from the speaker 63 (step S1001). Then, it is determined whether a given period of time elapses after the alarm reproduction process starts (step S1002). In the third embodiment, the period of time is set at 10 minutes; however, it has only to be decided in consideration of various reasons.

When it is determined that the given period of time does not elapse, it is determined whether a given operation button is depressed or not (step S1003). The given operation button means an operation button provided on the front of the main body 51, such as the recording button 53 and the stop button 54 and an operation button provided on that side of the main body 51 on which the reproduction Button 55 is arranged. In consideration of various reasons, however, either the operation button provided on the front of the main body 51 or the operation button provided on one side of the main body 51 can be used as the given button. Further, only a specific button can be chosen from these buttons as the given button.

When it is determined that the given operation button is not depressed, the flow returns to step S1002 to repeat the above process until the given period of time elapses or the given operation button is depressed. When it is determined that the given period of time has elapsed, the output of the alarm is stopped (step S1004) and the flow returns to the original routine.

When the given operation button is depressed, the output of the alarm is stopped (step S1005) to determine whether there is a file to be alarm-reproduced (step S1006). When there is no file to be alarm-reproduced because the memory card 117 is removed from the main body or a target file is erased, a warning that there is no file to be alarm-reproduced is issued. When the given period of time elapses or the given operation button is depressed, the warning is stopped (step S1007) and the flow returns to the original routine.

When it is determined that there is a file to be alarm-reproduced, it is determined whether the operating mode is set in a mode for reproducing the file (step S1008). For example, an MP3 file is set as the file to be alarm-reproduced and the current operating mode is set in the recorder mode, or a DSS file is set as the file to be alarm-reproduced and the current operating mode is set in the player mode. When it is determined that these modes do not correspond to the file to be alarm-reproduced, they are switched to a mode corresponding to the file (step S1009). After the operating mode is switched to the mode corresponding to the file to be alarm-reproduced, the reproduction of the file is started (step S1010).

It is determined whether a given operation button is depressed or not during the reproduction of the file to be alarm-reproduced (step S1011). When the given operation button is not depressed, it is determined whether the reproduction is performed to the end of the file (step S1012). The above steps S1011 and S1012 are repeated until YES is obtained from one of these steps. If YES is obtained, the reproduction of the file is stopped (step S1013).

When the operating mode is changed by the process in step S1009, it is reset (step S1040). The current position information of the file is moved to the top of the original file before the alarm reproduction process is executed (step S1015). The alarm reproduction process ends and the flow returns to the original process routine.

The operating mode is restored in step S1014. When the operating mode switch 69 is a slide switch, it can be thought that the operating mode switch 69 is changed during the alarm reproduction. Consequently, the operating mode is not restored up to the process of step S1014, but when the alarm reproduction is completed, the state of the operating mode switch 69 can be detected to set the operating mode.

In this case, the current position information of the file has only to be moved to the top of the first file or the top of the file that has been alarm-reproduced.

Figure 26:
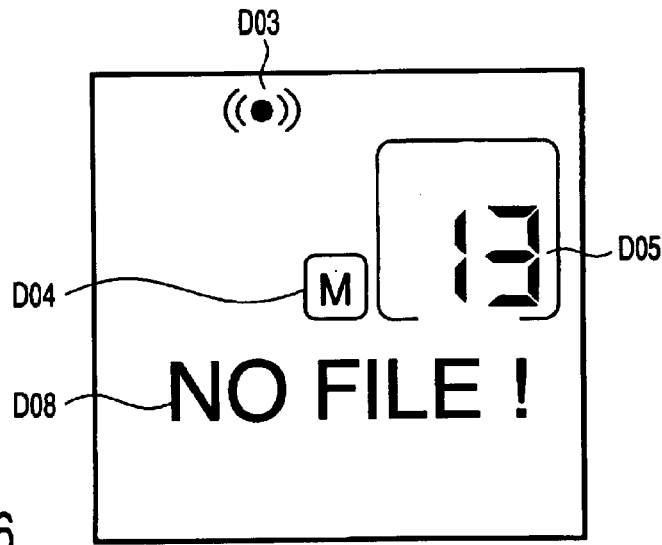
FIG. 26 is a diagram showing a main display 52 of an alarm operation in step S1007 in the above alarm reproduction process.

FIG. 26 is a diagram of the main display 52 in a warning operation in step S1007 during the alarm reproduction process. This display is made if a file to be alarm-reproduced cannot be accessed when alarm reproduction time comes.

The displays D04 and D05 allow an operator to know which is a file to be alarm-reproduced. "NO FILE" indicating that there is no file is displayed in that portion of Display D08 where a file name is usually displayed. The entire displayed screen blinks for a given period of time to strongly inform the operator that there is no file.

(Fourth Embodiment)

The fourth embodiment of the present invention is another embodiment directed to the reproduction level adjustment. In the fourth embodiment, the same reproduction level adjustment table is used in both the recorder and player modes. In other words, the set attenuation value of the recorder mode of the reproduction level adjustment table shown in FIG. 21 is used in both the recorder and player modes. A flag F for detecting a change from the recorder mode to the player mode is used.

Figure 27:
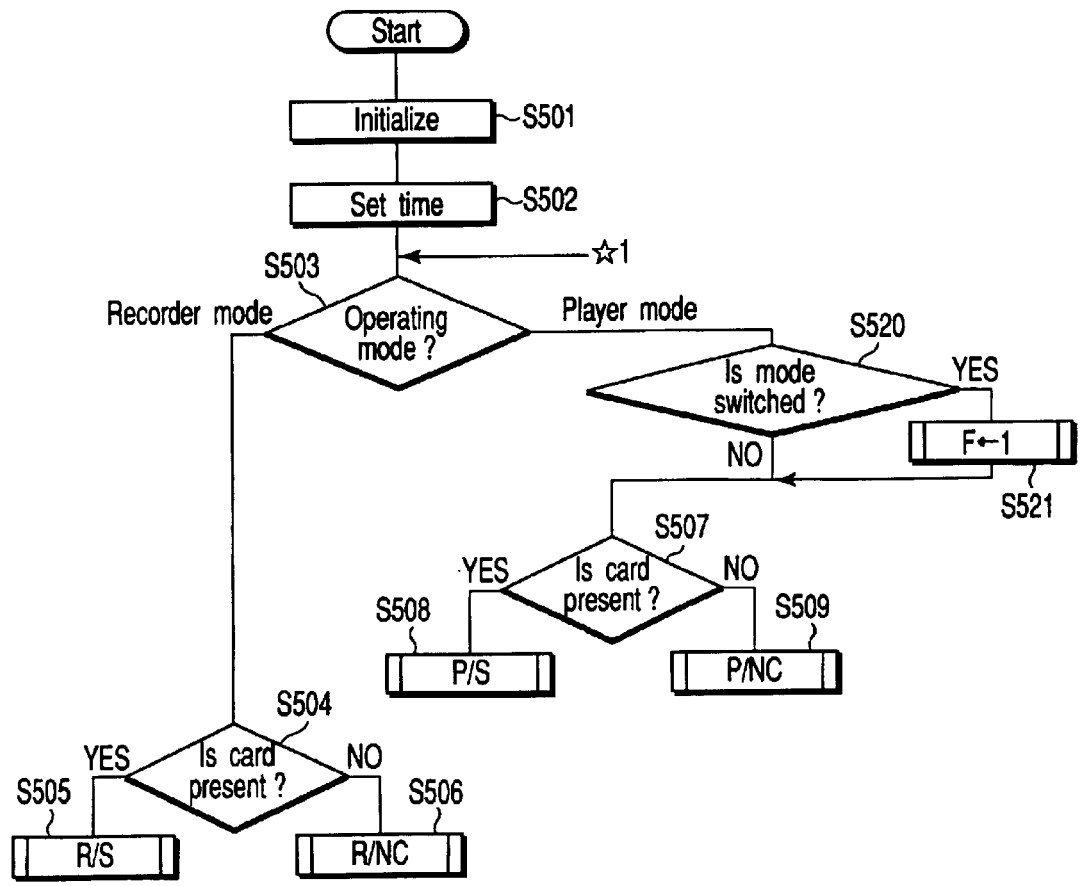
FIG. 27 is a main flowchart according to a fourth embodiment of the present invention.

FIG. 27 is a main flowchart of the fourth embodiment. Since steps S501 to S509 are the same as those of the first embodiment, their descriptions are omitted.

In step S520, it is determined whether the recorder mode is switched to the player mode. If it is determined that the recorder mode is switched to the player mode, the flow goes to step S521 to set "1" to the flag F. The flow then goes to step S507. If not, the flow advances to step S507 without setting "1" to the flag F.

FIG. 28 is a chart showing a flow of a reproduction process executed when the reproduction button 55 is depressed in the P/S process. As shown in FIG. 28, when the operating mode is set in the reproduction mode, it is determined whether "1" is set in the flag F in step S30. If "1" is set in the flag F, the flow goes to step S32 to determine whether the index value of volume for reproduction is six or more or determines a warning volume value. The determination level of the volume indication value is 18. If the indication value of volume for reproduction is six or more, the flow goes to step S34 to give a warning that the index value of volume for reproduction is six or more. This warning can be displayed on the screen or given by a beep or the like. A user has only to notice the warning. After the warning is given in step S34, the flow advances to step S36 to encourage a user to determine whether to perform reproduction. If the reproduction button 55 is depressed, the flow goes to step S38 to perform reproduction.

If the reproduction button 55 is not depressed in step S36, the flow moves to step S42 to determine whether the stop button 54 is depressed or not. When it is determined that the stop button 54 is depressed in step S42, the process ends and the flow returns to the original flowchart. When it is determined that the stop button 54 is not depressed, the flow returns to step S36. In other words, the determination of steps S36 and S42 is repeated until one of the reproduction button 55 and the stop button 54 is depressed. After the reproduction in step S38, the flow goes to step S40 and the flag F is restored to "0". The process ends.

In the fourth embodiment, the warning volume value is described as a fixed value (index value 6, volume indication value 18). The present invention is not limited to this. For example, a user can change the warning volume value to a desired value by storing it in the built-in memory 22 as a variable value and adding a step of changing the warning volume value in the menu setting process. Further, in the same structure, a user can decide in the menu setting process whether to execute the process in steps S30 to S36 and change the flow of the reproduction process shown in FIG. 28 so as to skip the process in steps S30 to S36 before step S30 in accordance with the setting.

As described above, according to the embodiments of the present invention, even when a reproduction volume is very high, a warning is given to a user to decide whether to perform reproduction. When a reproduction volume value is higher than intended by the user, it is lowered and thus data can be reproduced at the user's intended reproduction volume value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data recording and reproducing apparatus having a reproduction-only operating mode capable of reproducing a voice file and a recording and reproducing operating mode capable of recording and reproducing a voice file, comprising:

operating mode switching means for switching the operating mode to the recording and reproducing mode when an instruction to record a voice file is given in the reproduction-only mode; and recording means for recording the voice file after the operating mode is switched to the recording and reproducing mode.

2. A data recording and reproducing apparatus having a first operating mode capable of control related to both reproducing and recording a voice file coded by a first coding scheme and a second operating mode capable of control related to only reproduction out of reproducing and recording a voice file coded by a second coding scheme, comprising:

operating mode switching means for switching an operating mode to the first operating mode when an instruction to record a voice file is given in the second operating mode; and recording means for recording the voice file by the first coding scheme after the operating mode is switched to the first operating mode.

3. The data recording and reproducing apparatus according to claim 2, further comprising restoring means for restoring the operating mode to the second operating mode when the voice file is completely recorded.

4. The data recording and reproducing apparatus according to claim 2, further comprising:

an operating mode setting member which sets an operating mode manually;

detecting means for detecting the operating mode set by the operating setting member when the voice file is completely recorded; and operating mode setting means for setting the operating mode accordance with a detection result of the detecting means.

5. The data recording and reproducing apparatus according to claim 2, further comprising:

detecting means for detecting whether a voice file can be recorded on a recording medium; and inhibiting means for inhibiting the operating mode switching means from switching the operating mode to the first operating mode when the detecting means detects that the voice file cannot be recorded on the recording medium.

6. A data recording and reproducing apparatus having a player mode serving as an operating mode related to control of only reproduction out of reproducing and recording voice data and a recorder mode serving as an operating mode capable of control related to both reproducing and recording voice data, comprising:

search means for fast-forwarding or fast-reversing voice data;

reproducing means for reproducing voice data; and control means for controlling reproduction of voice data during operation of fast-forwarding or fast-reversing voice data by the search means, in accordance with the operating modes.

7. The data recording and reproducing apparatus according to claim 6, wherein the control means controls whether the fast-forwarded or fast-reversed voice data is reproduced in accordance with the operating modes, during the fast-forwarding or fast-reversing operation.

8. The data recording and reproducing apparatus according to claim 7, wherein the control means controls the reproduction so as to reproduce the voice data when the voice data is fast-forwarded or fast-reversed in the recorder mode, during the fast-forwarding or fast-reversing operation.

9. A data recording and reproducing apparatus having a first operating mode capable of control related to both reproducing and recording a voice file and a second operating mode capable of control related to only reproduction out of reproducing and recording a voice file, comprising setting means for setting an upper limit of a reproduction level when audio data is reproduced in the second operating mode.

10. A data recording and reproducing apparatus having a first operating mode capable of processing first coded data and a second operating mode capable of processing second data whose sound quality is higher than that of the first coded data, comprising:

warning means for giving a warning when a volume value is a given value or more when an operating mode is shifted to other operating mode; and inhibiting means for inhibiting voice data from being reproduced until a given operation is performed when the volume value is the given value or more when the operating mode is shifted to other operating mode.

11. The data recording and reproducing apparatus of claim 10 wherein the warning means gives the warning and the inhibiting means inhibits the reproduction only when the first operating mode is shifted to the second operating mode.

12. A data recording and reproducing apparatus according to claim 10, further comprising releasing means for releasing inhibition of reproduction of the voice data when the volume value is set to the given value or less while the reproduction of voice data is being inhibited.

13. A data reproducing apparatus having a first operating mode capable of reproducing a voice file coded by a first coding scheme and a second operating mode capable of reproducing a voice file coded by a second coding scheme comprising:

time setting means for setting arbitrary set time;

selecting means for selecting an arbitrary voice file;

reproducing means for reproducing a voice file;

control means for performing control to reproduce the selected voice file when an operating mode in which the set time comes corresponds to an operating mode capable of reproducing the selected voice file; and warning means for giving a warning when the operating mode in which the set time comes differs from the operating mode capable of reproducing the selected voice file.

14. The data reproducing apparatus according to claim 13, further comprising alarm output means for outputting an alarm and wherein the control means for performing control to output an alarm when the set time comes and then reproduce the selected voice file in the mode capable of reproducing the selected voice file after a given operation button of the data reproducing apparatus is depressed.

15. The data reproducing apparatus according to claim 13, wherein when the operating mode differs from the mode capable of reproducing the selected voice file, the control means inhibits the selected voice file from being reproduced until the operating mode becomes equal to the mode capable of reproducing the selected voice file and ends the warning when the operating mode becomes equal to the mode capable of reproducing the selected voice file.

16. A data reproducing apparatus capable of recording a first voice file processable only in a first operating mode and a second voice file processable only in second operating mode, comprising:

time setting means for setting arbitrary set time;

selecting means for selecting an arbitrary voice file;

reproducing means for reproducing a voice file;

control means for performing control to reproduce the selected voice file when an operating mode in which the set time comes corresponds to an operating mode corresponding to the selected voice file; and warning means for giving a warning when the operating mode in which the set time comes differs from the operating mode capable of reproducing the selected voice file.

17. The data reproducing apparatus according to claim 16, further comprising alarm output means for outputting an alarm and wherein the control means for performing control to output an alarm when the set time comes and then reproduce the selected voice file in the operating mode corresponding to the selected voice file after a given operation button of the data reproducing apparatus is depressed.

18. A data reproducing apparatus capable of recording a first voice file processable only in a first operating mode and a second voice file processable only in second operating mode, coeprising:

time setting means for setting arbitrary set time;

selecting means for selecting an arbitrary voice file;

reproducing means for reproducing a voice file; and control means for performing control to reproduce the selected voice file when an operating mode is an operating mode corresponds to the selected voice file when the set time comes, and changes the operating mode to the operating mode corresponding to the selected voice file when the operating mode is not the operating mode corresponding to the selected voice file and then reproducing the selected voice file.

19. The data reproducing apparatus according to claim 18, further comprising operating mode restoring means for restoring the operating mode after the selected voice file is completely reproduced when the control means changes the operating mode.

20. The data reproducing apparatus according to claim 18, further comprising operating mode shifting means for determining a state of an operating mode setting means after the selected voice file is completely reproduced and shifting the operating mode to an operating mode corresponding to a setting of the operating mode setting means.

21. A data recording and reproducing apparatus having a recording and reproducing operating mode capable of recording and reproducing first audio information and a reproducing-only operating mode capable of reproducing second audio information, comprising:

operating mode switching means for switching the operating mode to the recording and reproducing mode when a command to record first audio information is given while in the reproducing-only mode and for switching the operating mode to the reproducing-only mode while in the recording and reproducing mode;

recording means for recording the first audio information; and reproducing means for reproducing the first and second audio information.

22. The data recording and reproducing apparatus according to claim 21, wherein the first audio information is voice information, and the second audio information is music information.

23. The data recording and reproducing apparatus according to claim 21, wherein the first audio information is recorded using a coding scheme suitable for at least one of high compression and long playing recordings.

24. The data recording and reproducing apparatus according to claim 23, wherein the coding scheme is implemented using a DSS system.

25. The data recording and reproducing apparatus according to claim 21, wherein the second audio information is in at least one of a format and a coding scheme capable of high-quality audio reproduction.

26. The data recording and reproducing apparatus according to claim 25, wherein the at least one of a format and a coding scheme is at least one of WMA and MP3.

27. The data recording and reproducing apparatus according to claim 21, wherein the command to record first audio information given while in the reproducing-only mode is generated by at least one depression of a single switch.

28. The data recording and reproducing apparatus according to claim 21, wherein the switching means from the recording and reproducing mode to the reproducing only mode includes an automatic switching means.

29. The data recording and reproducing apparatus according to claim 28, wherein the automatic switching means switches from the recording and reproducing mode to the reproducing only mode when no storage space is left in an allocated memory area.

30. The data recoding and reproducing apparatus according to claim 29, wherein the automatic switching means switches from the recording and reproducing mode to the reproducing only mode at a stored pre-set time.

* * * * *